United States Patent
Lee et al.

(10) Patent No.: US 10,134,686 B2
(45) Date of Patent: Nov. 20, 2018

(54) SYSTEMS AND METHODS FOR PROVIDING ELECTROMAGNETIC INTERFERENCE (EMI) COMPARTMENT SHIELDING FOR COMPONENTS DISPOSED INSIDE OF SYSTEM ELECTRONIC PACKAGES

(71) Applicant: Avago Technologies General IP (Singapore) Pte. Ltd., Singapore (SG)

(72) Inventors: Ah Ron Lee, Seoul (KR); Deog Soon Choi, Seoul (KR); Young Ho Lee, Seoul (KR); Boon Keat Tan, Singapore (SG); Jin Ho Choi, Seoul (KR)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/796,285

(22) Filed: Oct. 27, 2017

(65) Prior Publication Data

US 2018/0130755 A1   May 10, 2018

Related U.S. Application Data

(63) Continuation-in-part of application No. 15/282,882, filed on Sep. 30, 2016, and a continuation-in-part of application No. 15/499,657, filed on Apr. 27, 2017.

(51) Int. Cl.
*H01L 23/552* (2006.01)
*H01L 23/538* (2006.01)
(Continued)

(52) U.S. Cl.
CPC .......... *H01L 23/552* (2013.01); *H01L 21/565* (2013.01); *H01L 23/3121* (2013.01); *H01L 23/5386* (2013.01); *H01L 23/585* (2013.01); *H01L 25/0655* (2013.01); *H01L 25/16* (2013.01); *H01L 24/16* (2013.01); *H01L 24/81* (2013.01); *H01L 25/50* (2013.01);
(Continued)

(58) Field of Classification Search
CPC ....... H05K 1/0216; H05K 1/181; H05K 1/111
See application file for complete search history.

(56) References Cited

U.S. PATENT DOCUMENTS 9,818,699 B2 * 11/2017 Kim ...................... H01L 23/552
2007/0194281 A1    8/2007 Gao
(Continued)

FOREIGN PATENT DOCUMENTS

CN          104659022 A1      5/2015

OTHER PUBLICATIONS

English language machine translation of CN104659022A1, 6 pages.

*Primary Examiner* — Hoa C Nguyen
*Assistant Examiner* — Amol Patel

(57) ABSTRACT

A compartment EMI shield is provided that is suitable for use in system module packages having thin form factors and/or smaller widths and/or lengths. The compartment EMI shield comprises a fence arranged along a compartment boundary at least in between first and second sets of electrical components of the system module package. The fence being configured to attenuate EMI of a frequency of interest traveling in at least one of a first direction and a second direction, where the first direction is from the first set of electrical components toward the second set of electrical components and the second direction is from the second set of electrical components toward the first set of electrical components.

21 Claims, 21 Drawing Sheets

(51) Int. Cl.
*H01L 25/065* (2006.01)
*H01L 25/16* (2006.01)
*H01L 23/31* (2006.01)
*H01L 23/58* (2006.01)
*H01L 21/56* (2006.01)
*H01L 23/00* (2006.01)
*H01L 25/00* (2006.01)

(52) U.S. Cl.
CPC ............... *H01L 2224/16225* (2013.01); *H01L 2224/81815* (2013.01); *H01L 2924/19105* (2013.01); *H01L 2924/19107* (2013.01); *H01L 2924/3025* (2013.01)

(56) References Cited

U.S. PATENT DOCUMENTS

| | | | |
|---|---|---|---|
| 2007/0241440 | A1 | 10/2007 | Hoang et al. |
| 2013/0286609 | A1* | 10/2013 | Merz .................... H05K 1/0216 361/760 |
| 2014/0078677 | A1* | 3/2014 | Dolci ....................... H01L 23/10 361/719 |
| 2016/0120039 | A1* | 4/2016 | Bang ....................... H01L 23/36 29/832 |
| 2017/0290209 | A1* | 10/2017 | Craig ..................... H05K 1/021 |

* cited by examiner

SYSTEMS AND METHODS FOR PROVIDING ELECTROMAGNETIC INTERFERENCE (EMI) COMPARTMENT SHIELDING FOR COMPONENTS DISPOSED INSIDE OF SYSTEM ELECTRONIC PACKAGES

CROSS-REFERENCE TO RELATED APPLICATIONS

This application is a continuation-in-part (CIP) application of, claims priority to, and claims the benefit of the filing date of a nonprovisional application having U.S. application Ser. No. 15/282,882 (now allowed) entitled "SYSTEMS AND METHODS FOR PROVIDING ELECTROMAGNETIC INTERFERENCE (EMI) COMPARTMENT SHIELDING FOR COMPONENTS DISPOSED INSIDE OF SYSTEM ELECTRONIC PACKAGES," filed on Sep. 30, 2016, which is hereby incorporated by reference herein in its entirety, and is a CIP application of, claims priority to, and claims the benefit of the filing date of a nonprovisional application having U.S. Ser. No. 15/499,657 entitled "SYSTEMS AND METHODS FOR PROVIDING ELECTROMAGNETIC INTERFERENCE (EMI) SHIELDING BETWEEN INDUCTORS OF A RADIO FREQUENCY (RF) MODULE," filed on Apr. 27, 2017, which is hereby incorporated by reference herein in its entirety.

TECHNICAL FIELD OF THE INVENTION

The invention relates to electromagnetic interference (EMI) shielding. More particularly, the invention relates to providing compartment EMI shielding for components that are contained within system electronic packages.

BACKGROUND OF THE INVENTION

A system-in-a-package (SiP) is a module package that contains a plurality of integrated circuit (IC) chips and/or other circuit components (e.g., transistors, capacitors, indictors and resistors) that are mounted on a printed circuit board (PCB) of the SiP module package. Such module packages are commonly used in wireless devices, such as smart phones, for example. The module package typically includes a system encapsulating mold compound (EMC) that encapsulates the IC chips and other circuit components. The module package typically also includes a system EMI shield for reducing EMI emission from the module package. The system EMI shield is typically a conformal EMI shield formed on the module package by using, for example, a metal sputtering process to form a metal coating that conforms to the outer surface of the system EMC.

While the system EMI shield is effective at reducing EMI emissions from the module package as a whole, it has no effect on EMI emissions within the module package. Some of the ICs and other circuit components contained within the module package comprise radio frequency (RF) functional blocks. These RF functional blocks emit EMI that can interfere with the operations of other RF functional blocks within the module package. For example, one of the IC chips of one of the RF functional blocks may be a multi-band power amplifier (PA) chip supporting different modes of operation (e.g., Code Division Multiple Access (CDMA), Universal Mobile Telecommunications System (UMTS), Long Term Evolution (LTE), and Global System for Communication (GSM)/Enhanced Data GSM Environment (EDGE)). Another of the IC chips of another of the RF functional blocks may be, for example, a multi-band low noise amplifier (LNA) chip capable of supporting different modes of operation.

Without suitable EMI shielding of these RF functional blocks from one another, EMI emitted from one RF functional block may detrimentally impact the operations of another RF functional block. One known EMI shielding solution that is used for this purpose is an electrically-conductive metal "can" that is placed over an RF functional block to reduce EMI emissions from the RF functional block. However, current trends to reduce the sizes of SiPs and/or to increase the amounts or types of functionality that are included in them have made the use of electrically-conductive metal cans impractical due to their size and due to space constraints of environments in which the SiPs are used (e.g., smart phones).

Accordingly, a need exists for a compartment EMI shielding solution that is effective at providing EMI shielding within a module package and that is efficient in terms of space utilization and costs.

DETAILED DESCRIPTION

Figure 1:
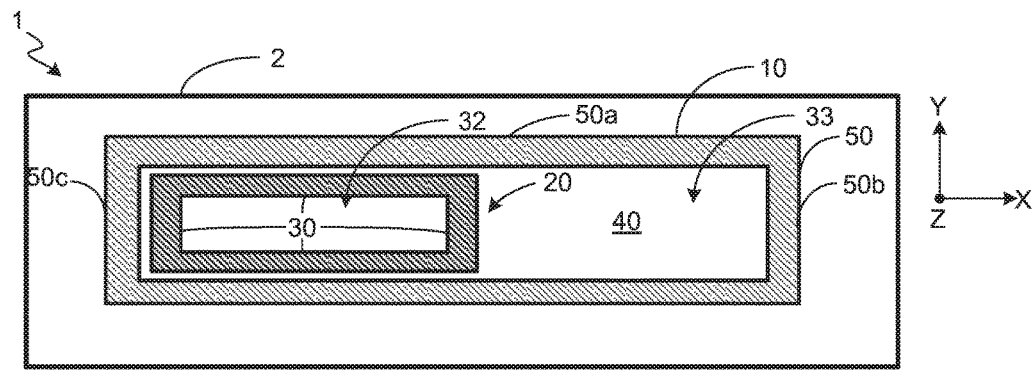
FIG. 1 illustrates a block diagram from a top view of an electronic device that includes a compartment EMI shield in accordance with a representative embodiment.

In accordance with illustrative embodiments, a compartment EMI shield is provided that is suitable for use in system module packages having thin form factors and/or smaller widths and/or lengths. The compartment EMI shield comprises a fence arranged along a compartment boundary at least in between first and second sets of electrical components of the system module package. In accordance with an embodiment, the compartment EMI shield further comprises a substantially horizontal conductive structure that is coupled to the conductive fence. The compartment EMI shield is configured to attenuate EMI of a frequency of interest traveling in at least one of a first direction and a second direction, where the first direction is from the first set of electrical components toward the second set of electrical components and the second direction is from the second set of electrical components toward the first set of electrical components.

As the form factors of system module packages such as SiP module packages, for example, are becoming thinner (i.e., shorter in the Z-dimension), there is a need for compartment EMI shielding solutions that can be structured to accommodate the thinner form factors while being effective at attenuating EMI of the frequency of interest. In addition, in many cases, the lengths (X-dimension) and/or widths (Y-dimension) of the system module packages are also decreasing. Therefore, in some cases, there is also a need for compartment EMI shielding solutions that can be structured to accommodate the smaller X- and/or Y-dimensions of the system module packages while being effective at sufficiently attenuating EMI of the frequency of interest. The following representative embodiments demonstrate examples of EMI shielding solutions having various structures that are capable of meeting these demands.

The aforementioned U.S. application Ser. No. 15/282,882 discloses examples of various compartment EMI shielding solutions. In some embodiments, the compartment EMI shielding solution comprises a plurality of electrically-conductive wires, each of which has opposite ends that are connected to a common electrical ground structure and a portion in between the opposite ends that passes over electrical components of the module package without coming into contact with them. In cases in which system module packages have very thin form factors, it becomes more difficult to ensure that the portions of the wires that pass over the electrical components do not come into contact with them due to the reduced space in between the top surfaces of the electrical components and the top of an EMC of the module package. The following representative embodiments provide examples of EMI shielding solutions that overcome this difficulty and that provide additional features and advantages.

It should also be understood that the word "example," as used herein, is intended to be non-exclusionary and non-limiting in nature. More particularly, the word "exemplary," as used herein, indicates one among several examples, and it should be understood that no undue emphasis or preference is being directed to the particular example being described. It should also be understood that the word "exemplary," as used herein, is intended to be non-exclusionary and non-limiting in nature.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a," "an" and "the" include both singular and plural referents, unless the context clearly dictates otherwise. Thus, for example, "a device" includes one device and plural devices. The term "substantially" means to within limits or degrees acceptable to those of skill in the art. For example, the term "substantially parallel to" means that a structure or device may not be made perfectly parallel to some other structure or device due to tolerances or imperfections in the process by which the structures or devices are made. The term "approximately" means to within an acceptable limit or amount to one of ordinary skill in the art. Where a first device is said to be directly connected or directly coupled to a second device, this encompasses examples where the two devices are connected together without any intervening devices other than bonding material or devices. Where a first device is said to be coupled to a second device, this encompasses examples where the two devices are directly connected together without any intervening devices other than bonding material or devices and examples where the first and second devices are connected to one another via one or more intervening devices. The term "conductive," as that term is used herein, means electrically conductive and the term "conductive structures," as that term is used herein, means electrically-conductive structures that act as electrical conductors.

Exemplary, or representative, embodiments will now be described with reference to the figures, in which like reference numerals represent like components, elements or features. It should be noted that features, elements or components in the figures are not intended to be drawn to scale, emphasis being placed instead on demonstrating inventive principles and concepts.

Figure 2:
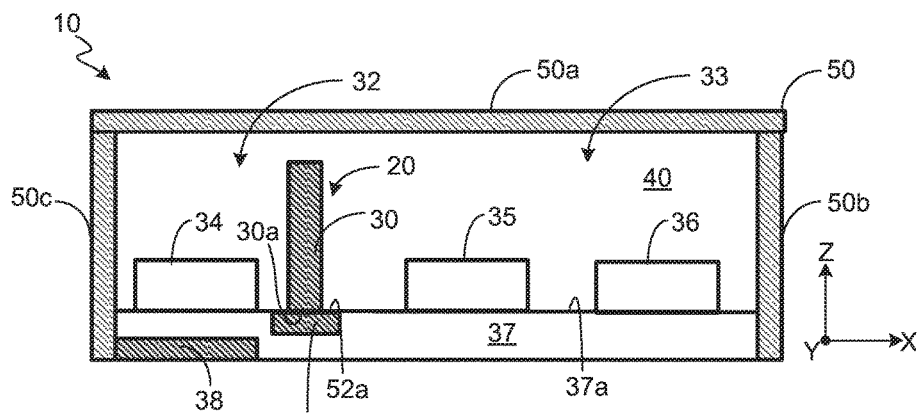
FIG. 2 illustrates a block diagram from a side view of a system module package of the electronic device shown in FIG. 1 that includes the compartment EMI shield in accordance with a representative embodiment.
Figure 3:
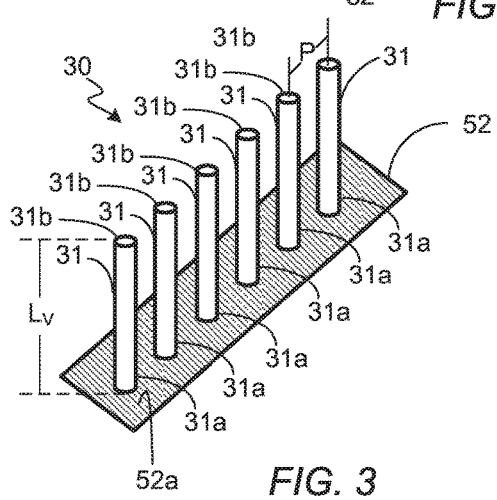
FIG. 3 illustrates a block diagram from a perspective view of a conductive fence of the compartment EMI shield shown in FIGS. 1 and 2 in accordance with a representative embodiment.
Figure 4:
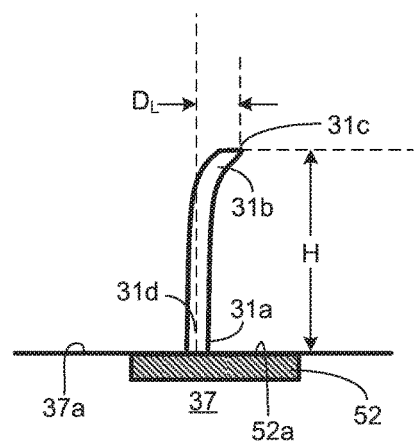
FIG. 4 illustrates a block diagram from a side plan view of an example of one of the substantially vertical conductive structures of the portion of the conductive fence shown in FIG. 3 in accordance with a representative embodiment.

FIG. 1 illustrates a block diagram from a top view of an electronic device 1 that includes a system module package 10 having a compartment EMI shield 20 in accordance with a representative embodiment. FIG. 2 illustrates a block diagram from a side view of the system module package 10 of the electronic device 1 shown in FIG. 1 that includes the compartment EMI shield 20 in accordance with a representative embodiment. FIG. 3 illustrates a block diagram from a perspective view of a conductive fence 30 of the compartment EMI shield 20 shown in FIGS. 1 and 2 in accordance with a representative embodiment. FIG. 4 illustrates a block diagram from a side plan view of an example of one of a plurality of substantially vertical conductive structures 31 of the portion of the conductive fence 30 shown in FIG. 3 in accordance with a representative embodiment.

The system module package 10 is mounted on and electrically interconnected with a system PCB 2 of the electronic device 1. The system module package 10 includes an EMC 40 having an assembly EMI shield 50 on outer surfaces thereof. The compartment EMI shield 20 comprises a conductive fence 30 disposed along a compartment boundary that defines a first compartment 32 having a first set of electrical components therein and separates the first compartment 32 from a second compartment 33 having a second set of electrical components therein. For clarity, the first and second sets of electrical components are not shown in FIG. 1. The second compartment 33 is external to the first compartment 32. For illustrative purposes, the first set of electrical components is shown in FIG. 2 as having only a first electrical component 34 and the second set of electrical components is shown in FIG. 2 as having second and third electrical components 35 and 36 respectively.

The conductive fence 30 extends laterally in at least one direction (e.g., X-direction and/or Y-direction) that is substantially parallel to a top surface 37a of a substrate 37 of the system module package 10 and extends substantially vertically (i.e., in the Z-direction) relative to the top surface 37a of the substrate 37. It should be noted that although FIGS. 1 and 2 depict the conductive fence 30 as a solid block, it typically comprises of a plurality of substantially vertical conductive structures, as will be described below in more detail. The conductive fence 30 extends along at least one side of the first electrical component 34, which is mounted on a top surface 37a of a substrate 37 in the first compartment 32. As will be described below in more detail, the conductive fence 30 may extend along multiple sides of the first electrical component 34 or it may extend along only a single side of the first electrical component 34 in between the first electrical component 34 and the second and third electrical components 35 and 36, respectively. In addition to including the conductive fence 30, the compartment EMI shield 20 may include a bottom compartment shield 38 that extends substantially parallel to the top surface 37a of the substrate 37.

A bottom end 30a of the conductive fence 30 is electrically and mechanically coupled to a conductive strip 52, which mechanically couples the conductive fence 30 to the top surface 37a of the substrate 37. The conductive strip 52 is at a common voltage potential and functions as a common electrical ground structure for providing a common voltage potential to the entirety of the conductive fence 30. In accordance with this representative embodiment, the conductive strip 52 has a top surface 52a that is coplanar with the top surface 37a of the substrate 37. However, as will be described below in more detail, the conductive strip 52 may be an internal conductive strip disposed beneath the top surface 37a of the substrate 37 or it may be a separate structure from the substrate 37 that is disposed on the top surface 37a of the substrate 37.

Each of the first and second sets of electrical components has a component height corresponding to the tallest electrical component of each of the first and second sets measured from the top surface 37a of the substrate 37 in a direction substantially normal to the top surface 37a of the substrate 37 to the top of the respective electrical component. The conductive fence 30 has a fence height measured from the top surface 37a of the substrate 37 in a direction substantially normal to the top surface 37a of the substrate 37 to the top of the conductive fence 30. The component heights are less than the fence height.

The assembly EMI shield 50 includes a top assembly EMI shield 50a and first and second side assembly EMI shields 50b and 50c, respectively. In the representative embodiment shown in FIGS. 1 and 2, the conductive fence 30 is spaced apart from the top assembly EMI shield 50a by a preselected distance, but in other embodiments, the conductive fence 30 is in contact with the top assembly EMI shield 50a, as will be described below in more detail. In such case, the conductive fence 30 and the top assembly EMI shield 50a are two distinct, or physically separated structures, but are in physical contact with one another to establish an electrical coupling between them.

As shown in FIG. 2, the conductive fence 30 extends substantially vertically relative to the top surface 37a of the substrate 37, i.e., substantially normal to the top surface 37a of the substrate 37. The conductive fence 30 is configured to attenuate EMI of a frequency of interest traveling in at least one of a first direction and a second direction, where the first direction is from the first set of electrical components toward the second set of electrical components and the second direction being from the second set of electrical components toward the first set of electrical components.

The conductive fence 30 may be constructed in a number of ways, examples of which are described with reference to FIGS. 8A-27B. The conductive fence 30 typically comprises a plurality of substantially vertical conductive structures 31 having first ends 31a that are electrically coupled to the top surface 52a of the conductive strip 52 and second ends 31b that are a preselected distance away from the respective first ends 31a such that the substantially vertical conductive structures 31 are of a vertical length, $L_V$. Typically, all of the substantially vertical conductive structures 31 are of substantially equal length $L_V$, although they may vary slightly in length due to tolerance variations in the process by which they are made. Adjacent substantially vertical conductive structures 31 are spaced apart from one another by a pitch, P. The pitch P is preselected based at least in part on the frequency of interest or frequency range of interest of EMI that the compartment EMI shield 20 is intended to attenuate. For example, a system module assembly for processing signals at a frequency of 1 GHz may need to attenuate noise at higher frequency such as 10 GHz or higher. The pitch P suitable for attenuating EMI of such higher frequencies is usually substantially lower than the wavelength of the EMI having the higher frequencies which may be a few centimeters. The pitch P suitable for this example may be between a lower limit of 10 microns and a higher limit of 500 microns. The lower limit is usually determined by the precision of manufacturing equipment, which limits how close two adjacent substantially vertical conductive structures 31 can be put together. In accordance with a representative embodiment, the substantially vertical conductive structures 31 are bond wires formed via a wire bonding process. The substantially vertical conductive structures 31 may be, for example, electrical bond wires, conductive rails, conductive leads of a semiconductor package, conductive plates of a semiconductor package, or combinations thereof, as will be described below in more detail.

With reference to FIG. 4, the substantially vertical conductive structures 31 are not perfectly vertical, but rather, have a highest point 31c that is at a height, H, from the top surface 37a of the substrate 37 in a direction substantially normal to the top surface 37a of the substrate 37 that is at least twice as great as a lateral distance, $D_L$, of the highest point 31c from a center 31d of the first end 31a of the respective substantially vertical conductive structure 31 in a direction substantially parallel to the top surface 37a of the substrate 37. In accordance with an embodiment, the height, H, is at least four times as great as the lateral distance, $D_L$. In embodiments in which the plurality of substantially vertical conductive structures 31 corresponds to a plurality of bond wires, the bond wires may have wavy patterns or shapes, and may be arranged in a synchronized manner. For example, the bond wires may be slightly bent, as shown in FIG. 4, while meeting the aforementioned height H-to-lateral distance $D_L$ definition. For example, the bond wires may have a top portion that may bend outwardly, inwardly and/or laterally. In yet another embodiment, each bond wire may have both ends connected to the substrate 37 with the middle portion of the bond wire extending along the fence plane to form the conductive fence 30, as will be described below in more detail with reference to FIGS. 12A-16.

The plurality of substantially vertical conductive structures 31 are electrically connected to the conductive strip 52, which provides a common voltage potential to all of the substantially vertical conductive structures 31 so as not to induce an electric field between the substantially vertical conductive structures 31.

As indicated above, the compartment EMI shield 20 may be disposed at a preselected distance away from the top assembly EMI shield 50a or it may be in contact with the top assembly EMI shield 20. The top assembly EMI shield 50a may be, for example, a coating of metal that is formed on the EMC 40 (e.g., via a sputtering process), whereas the substantially vertical conductive structures 31 may be substantially vertical bond wires. The bond wires may be in physical contact with the top assembly EMI shield 50a to establish an electrical coupling between the bond wires and the top assembly EMI shield 50a. In such cases, the second ends 31b may be thickened to establish a good electrical connection with the top assembly EMI shield 50a. In another representative embodiment, the second ends 31b may be flattened to facilitate electrical coupling between the bond wires and the top assembly EMI shield 50a.

In cases where the second ends 31b are spaced apart by a gap from the top assembly EMI shield 50a, the size of the gap is typically equal to, or nearly equal to, the pitch P between adjacent substantially vertical conductive structures 31 so as to attenuate EMI of the frequency or frequency range of interest.

Figure 5:
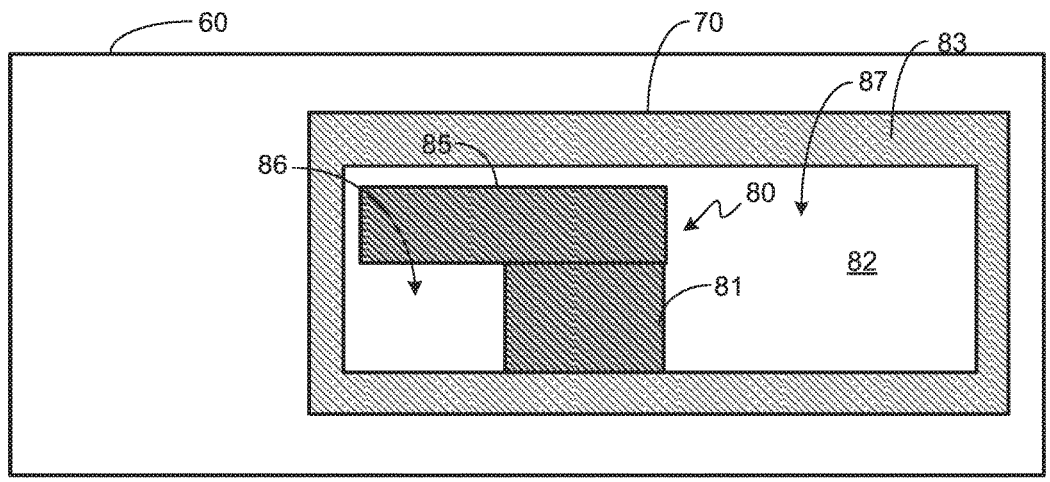
FIG. 5 illustrates a block diagram from a top view of an electronic device that includes a compartment EMI shield in accordance with a representative embodiment.
Figure 6:
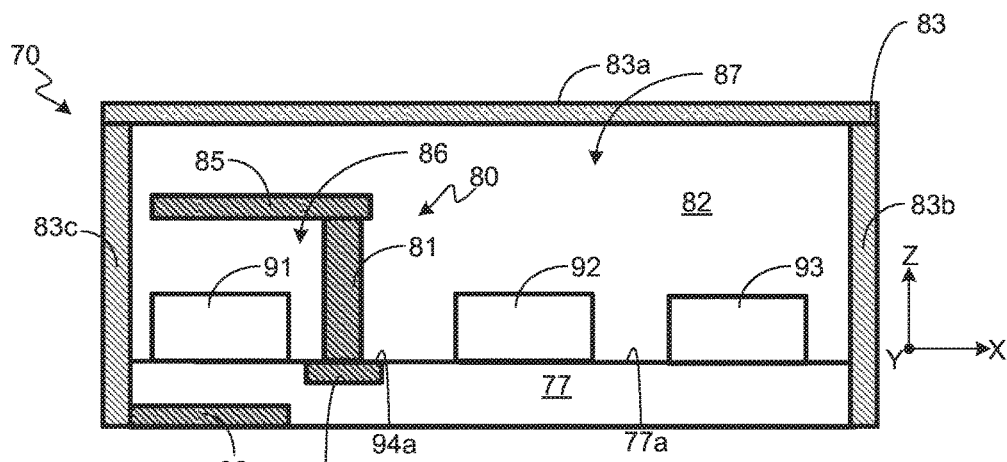
FIG. 6 illustrates a block diagram from a side view of a system module package of the electronic device shown in FIG. 5 that includes the compartment EMI shield in accordance with a representative embodiment.
Figure 7:
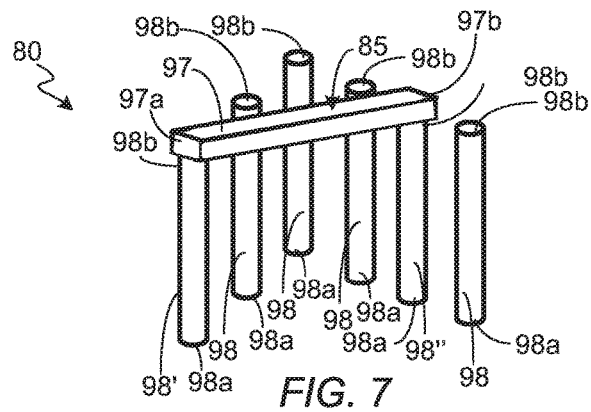
FIG. 7 illustrates a block diagram from a perspective view of a conductive fence of the compartment EMI shield shown in FIGS. 5 and 6 in accordance with a representative embodiment.

FIG. 5 illustrates a block diagram from a top view of an electronic device 60 that includes a system module package 70 having a compartment EMI shield 80 in accordance with a representative embodiment. FIG. 6 illustrates a block diagram from a side view of the system module package 70 of the electronic device 60 shown in FIG. 5 that includes the compartment EMI shield 80 in accordance with a representative embodiment. FIG. 7 illustrates a block diagram from a perspective view of the compartment EMI shield 80 shown in FIGS. 5 and 6 in accordance with a representative embodiment.

The system module package 70 includes an EMC 82 that encapsulates the components of the system module package 70, including the compartment EMI shield 80 and any other components that are mounted on a top surface 77a of a substrate 77 of the system module package 70, as will be described below in more detail with reference to FIG. 6. The EMC 82 has an assembly EMI shield 83 disposed on it or in it.

In accordance with this embodiment, the compartment EMI shield 80 comprises the conductive fence 81 and further comprises a substantially horizontal conductive structure 85 that is coupled to conductive fence 81. The conductive fence 81 extends along a compartment boundary at least in between first and second sets of electrical components of the system module package 70 and extends substantially normal to a top surface 77a of a substrate 77 of the system module package 70. The substantially horizontal conductive structure 85 extends substantially parallel to the top surface 77a of the substrate 77 and is disposed above the top surface 77a of the substrate 77.

The compartment boundary along which the conductive fence 81 extends defines a first compartment 86 and a second compartment 87, which is external to the first compartment 86. The first set of electrical components is disposed within the first compartment 86 and includes at least a first electrical component 91. The second set of electrical components is disposed within the second compartment 87 and includes at least a second electrical component 92, but in accordance with this representative embodiment is shown to also include a third electrical component 93. The compartment EMI shield 80 is configured to attenuate EMI of a frequency of interest traveling in at least one of a first direction from the first electrical component 91 toward the second and third electrical components 92 and 93, respectively, and a second direction from the second and third electrical components 92 and 93, respectively, toward the first electrical component 91.

The EMC 82 encapsulates the first, second and third electrical components 91, 92 and 93, respectively, and the compartment EMI shield 80. The conductive fence 81 is electrically coupled to a common electrical ground structure 94, which in this embodiment is a conductive strip having a top surface 94a that is coplanar with the top surface 77a of the substrate 77. The compartment EMI shield 74 may have an optional bottom EMI shield 96. In accordance with this representative embodiment, the assembly EMI shield 83 disposed on the EMC 82 comprises a top assembly EMI shield 83a and first and second side assembly EMI shields 83b and 83c, respectively.

With reference to FIG. 7, the substantially horizontal conductive structure 85 of the compartment EMI shield 80 comprises at least one conductive horizontal bar 97 and the conductive fence 81 comprises at least one of, and typically a plurality of, substantially vertical conductive structures 98 that are coupled to the conductive horizontal bar 97. The conductive horizontal bar 97 has first and second ends 97a and 97b, respectively. The substantially vertical conductive structures 98 have first and second ends 98a and 98b, respectively. The first ends 98a are electrically coupled to the common electrical ground structure 94 (FIG. 6). The second end 98b of at least a first substantially vertical conductive structure 98' of the plurality of substantially vertical conductive structures 98 is coupled to the first end 97a of the conductive horizontal bar 97.

The second end 97b of the conductive horizontal bar 97 may be left disconnected from the substantially vertical conductive structures 98, i.e., the conductive horizontal bar 97 may be cantilevered from the first substantially vertical conductive structure 98', or the second end 97b may be coupled to the second end 98b of a second substantially vertical conductive structure 98" of the plurality of substantially vertical conductive structures 98, as shown in FIG. 7. The compartment EMI shield 80 is configured to attenuate EMI of a frequency of interest traveling in at least one of a first direction from the first electrical component 91 toward the second and third electrical components 92 and 93, respectively, and a second direction from the second and third electrical components 92 and 93, respectively, toward the first electrical component 91.

As will be described below in more detail with reference to FIGS. 21-27B, the substantially vertical conductive structures 98 may be arranged in various suitable configurations and may have various suitable forms. In accordance with one representative embodiment, the substantially vertical conductive structures 98 are respective semiconductor packages arranged along a compartment boundary and forming the conductive fence 81 that separates the first compartment 86 from the second compartment 87, as will be described below in more detail with reference to FIGS. 23-27B. In accordance with this representative embodiment, the substantially horizontal conductive structure 85 comprises one or more of the conductive horizontal bars 97.

In accordance with another representative embodiment, the substantially horizontal conductive structure 85 comprises a conductive base formed of a plurality of the conductive horizontal bars 97. In accordance with this representative embodiment, the conductive fence 81 comprises conductive rails having ends that are coupled to the conductive base. The conductive base and the conductive rails are assembled as a pre-formed wire cage that is subsequently installed in the system module package 70 as the compartment EMI shield 80. Once the pre-formed wire cage has been installed, the conductive base is located above the first compartment 86 and has a bottom surface that is substantially parallel to the top surface 77a of the substrate 77 and the conductive rails are directly or indirectly coupled to the substrate 77. This embodiment is described below in detail with reference to FIGS. 21-22C.

Figure 8A:
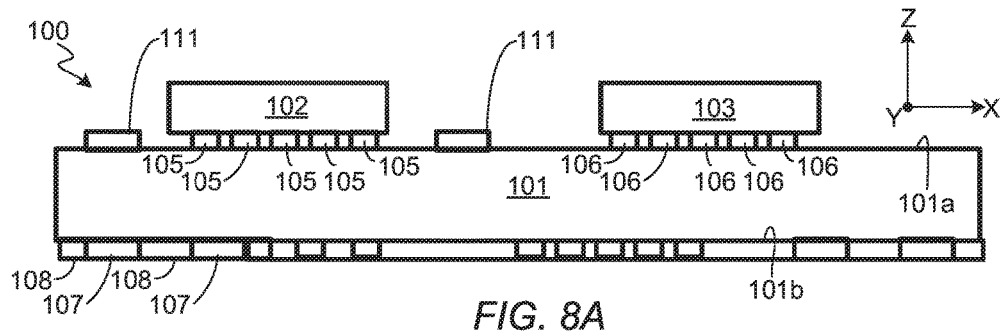
FIGS. 8A-8C illustrate side views of a portion of a system module package during various stages of forming a compartment EMI shield therein in accordance with a representative embodiment.
Figure 8B:
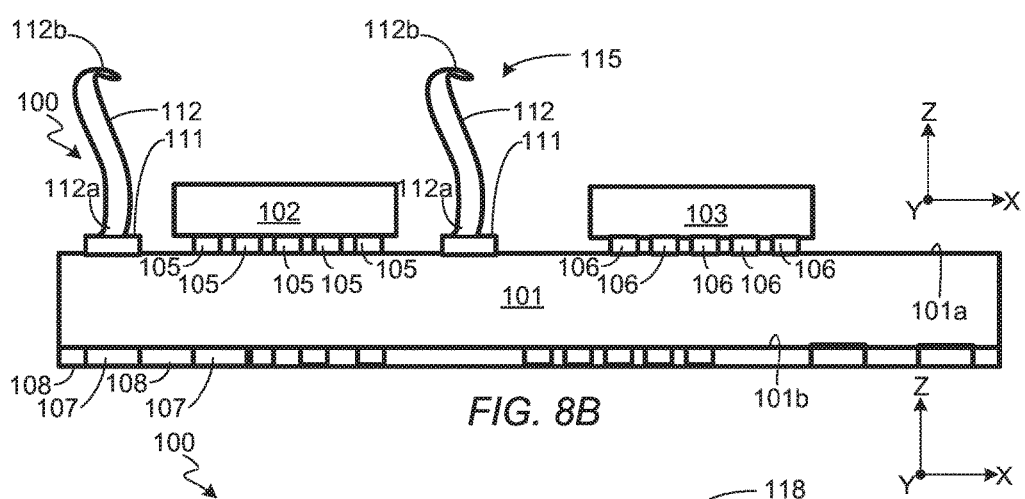
Figure 8C:
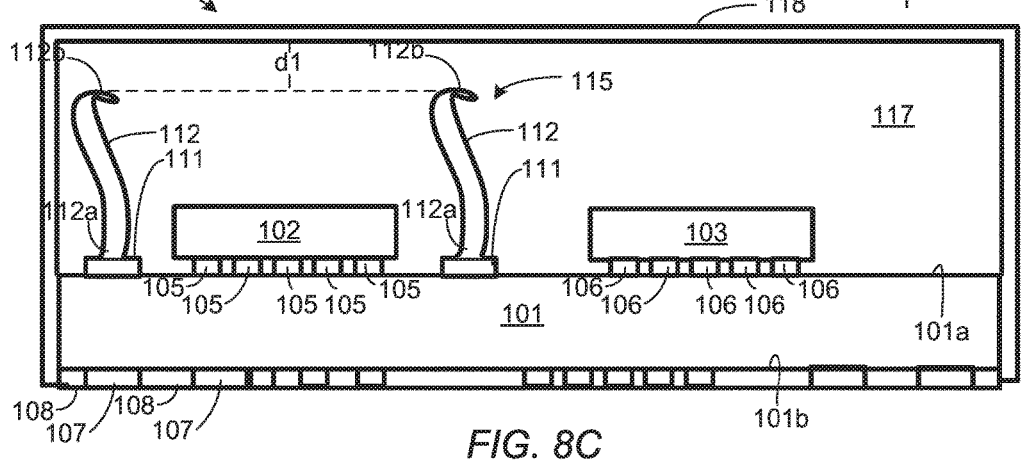

FIGS. 8A-8C illustrate side views of a portion of a system module package 100 during various stages of forming a compartment EMI shield in accordance with a representative embodiment. FIG. 8A depicts a substrate 101 of the system module package 100 having a top surface 101a on which first and second electrical components 102 and 103, respectively, of first and second sets of electrical components, respectively, are mounted using a known surface mount technology (SMT) process. The first and second sets of electrical components include the first and second electrical components 102 and 103, respectively, but may also include additional components, such as additional passive or active electrical or electronic components, for example.

During the SMT process, the first and second electrical components 102 and 103, respectively, are mounted at preselected locations on the top surface 101a of the substrate 101 and a solder reflow process is performed to form electrical bonds between respective sets of electrical contacts disposed on the top surface 101a of the substrate 101 and first and second sets of electrical connection elements 105 and 106, respectively (e.g., solder balls). The first and second sets of electrical connection elements 105 and 106, respectively, are in contact with respective electrical contacts of the first and second electrical components 102 and 103, respectively. Prior to the SMT processes being performed, electrical contacts 107 and a solder mask 108 are typically formed on the bottom surface 101b of the substrate 101. The solder mask 108 comprises dielectric material that is disposed in between the electrical contacts 107.

The substrate 101 may be, for example, a printed circuit board (PCB), such as a multi-layer PCB, for example. The inventive principles and concepts are not limited with respect to the type of substrate 101 that is used or with respect to the type of electrical components that are mounted on the substrate 101. The term "electrical component," as that term is used herein, denotes any passive or active electrical, electronic or optoelectronic component. Although the compartment EMI shield is being described herein with reference to its use in system module packages, the compartment EMI shield is not limited to being used in system module packages, but may be used in any type of package or assembly. The term "system module package," as that term is used herein, denotes an electronic or electrical assembly having at least first and second electrical components mounted on a substrate that may benefit in being EMI-shielded from one another.

As part of the SMT process or as part of a separate process, a common electrical ground structure 111 is formed in or on the substrate 101. The common electrical ground structure 111 is shown in FIGS. 8A-8C as being disposed on the top surface 101a of the substrate 101, but it could instead be disposed beneath the top surface 101a of the substrate 101, or partially above and partially beneath the top surface 101a of the substrate 101. If the common electrical ground structure 111 is formed on the top surface 101a of the substrate 101, it may be placed at preselected locations on the top surface 101a of the substrate 101 during the SMT processes. In other words, the common electrical ground structure 111 may comprise one or more surface-mount components that can be mounted via a pick-and-place SMT process, which typically involves the use of known machine vision technology to mount components at precise locations relative to one or more fiducials. If the common electrical ground structure 111 is formed beneath the top surface 101a of the substrate 101, or partially above and partially beneath the top surface 101a of the substrate 101, it may be, for example, a patterned metal layer formed via photolithographic processes. The common electrical ground structure 111 is typically a conductive strip that has top and bottom surfaces that are substantially parallel to one another and to the top surface 101a of the substrate 101.

FIG. 8B depicts the portion of the system module package 100 shown in FIG. 8A after a fence comprising a plurality of substantially vertical conductive structures 112 has been formed along a compartment boundary that extends about the first electrical component 102. Adjacent substantially vertical conductive structures 112 of the plurality of substantially vertical conductive structures 112 are separated by a pitch, P, that is preselected to ensure attenuation EMI of a frequency of interest. The pitch P is typically less than 500 microns. The fence comprising the plurality of substantially vertical conductive structures 112 defines a first compartment in which the first set of electrical components is mounted. For clarity, the plurality substantially vertical conductive structures 112 are shown in FIGS. 8B and 8C disposed on two opposite sides of the first electrical component 102, but the fence comprising the substantially vertical conductive structures 112 may be disposed adjacent a single side of the first electrical component 102 in between the first and second electrical components 102 and 103, respectively, adjacent two or more sides of the first electrical component 102, or it may extend around the entirety of the first electrical component 102 such that the fence is adjacent all four sides of the first electrical component 102 and is spaced apart therefrom a preselected distance in X- and Y-directions of an X, Y, Z Cartesian coordinate system. Similarly, the common electrical ground structure 111 may extend around the entirety of the compartment boundary surrounding the first electrical component 102 and other additional electrical components (not shown) in the first compartment 32 as illustrated in FIGS. 1-2.

The substantially vertical conductive structures 112 have first ends 112a that are mechanically coupled to the top surface 101a of the substrate 101 via the common electrical ground structure 111 and second ends 112b that are disposed a preselected distance above the respective first ends 112a in the Z-direction of the X, Y, Z Cartesian coordinate system shown in FIGS. 8A-8C. The first ends 112a are mechanically and electrically coupled to the common electrical ground structure 111. The term "substantially vertical," as that term is used herein, means substantially normal to the top surface 101a of the substrate 101. The top surface 101a of the substrate 101 is substantially planar and is substantially parallel to the X-Y plane of the X, Y, Z Cartesian coordinate system. The substantially vertical conductive structures 112 are substantially parallel to the Z-axis.

In accordance with a preferred embodiment, the fence comprising the substantially vertical conductive structures 112 does not pass over the top of the first electrical component 102. Reference numeral 115 represents the compartment EMI shield, which comprises the substantially vertical conductive structures 112 mechanically and electrically coupled on their first ends 112a to the common electrical ground structure 111. Because the compartment EMI shield 115 does not pass over the top of the first electrical component 102, there is no risk of the substantially vertical conductive structures 112 coming into contact with the first electrical component 102. This feature also allows the substantially vertical conductive structures 112 to be placed closer to the first electrical component 102 in the X- and Y-directions and to be relatively short in height, i.e., in the Z-direction, which, in turn, allows the compartment EMI shield 115 to be used in system module packages that have thin form factors (thin in the Z-dimension), that have short lengths (X-dimension) and that have short widths (Y-dimension).

The substantially vertical conductive structures 112 have a length in the Z-direction that is less than or equal to 4 millimeters (mm) and greater than the height of the tallest (Z-dimension) electrical component of the first set of electrical components. Preferably, the substantially vertical conductive structures 112 have a length in the Z-direction that is less than or equal to 1.5 times the height of the tallest electrical component of the first set of electrical components. The maximum length of the substantially vertical conductive structures 112 is always less than the height (Z-dimension) of the system module package 100. As will be described below in more detail with reference to FIGS. 9A and 9B, adjacent substantially vertical conductive structures 112 are separated by a pitch, P, that is preselected based at least in part on the frequency of interest or frequency range of interest that the compartment EMI shield is intended to attenuate.

With reference to FIG. 8C, after the SMT process has been completed and the compartment EMI shield 115 has been formed, an EMC 117 is formed on the top surface 101a of the substrate 101 to encapsulate the components that are mounted on the top surface 101a, including the first and second electrical components 102 and 103, respectively, and the compartment EMI shield 115. A top assembly EMI shield 118 is formed on the outer surface of the EMC 117. Optionally, the top assembly EMI shield 118 may comprise at least one side assembly EMI shield so as to cover the entire EMC on the substrate 101. In accordance with this representative embodiment, the top assembly EMI shield 118 is spaced apart from the second ends 112b of the substantially vertical conductive structures 112 in the Z-direction by a preselected distance, d1, but is electrically coupled to the common electrical ground structure 111. The preselected distance is preselected based on a frequency of interest or frequency range of interest that the compartment EMI shield 513 is intended to attenuate. The preselected distance d1 is typically equal to, or nearly equal to, the pitch P.

In accordance with a representative embodiment, the substantially vertical conductive structures 112 are bond wires formed during a wire bonding process. The process of assembling the system module package 100 is typically as follows. Wafer-level semiconductor processes are used to form the substrate 101 having the electrical contacts 107 and the solder mask 108 formed on the bottom surface 101b thereof. The aforementioned SMT process is then performed. A vertical wire bonding process is then performed to form the compartment EMI shield 115. A molding process is then performed to form the EMC 117 that encapsulates the first and second electrical components 102 and 103, respectively, and the compartment EMI shield 115. The top assembly EMI shield 118 is then formed on the outer surface of the EMC 117.

Figure 9A:
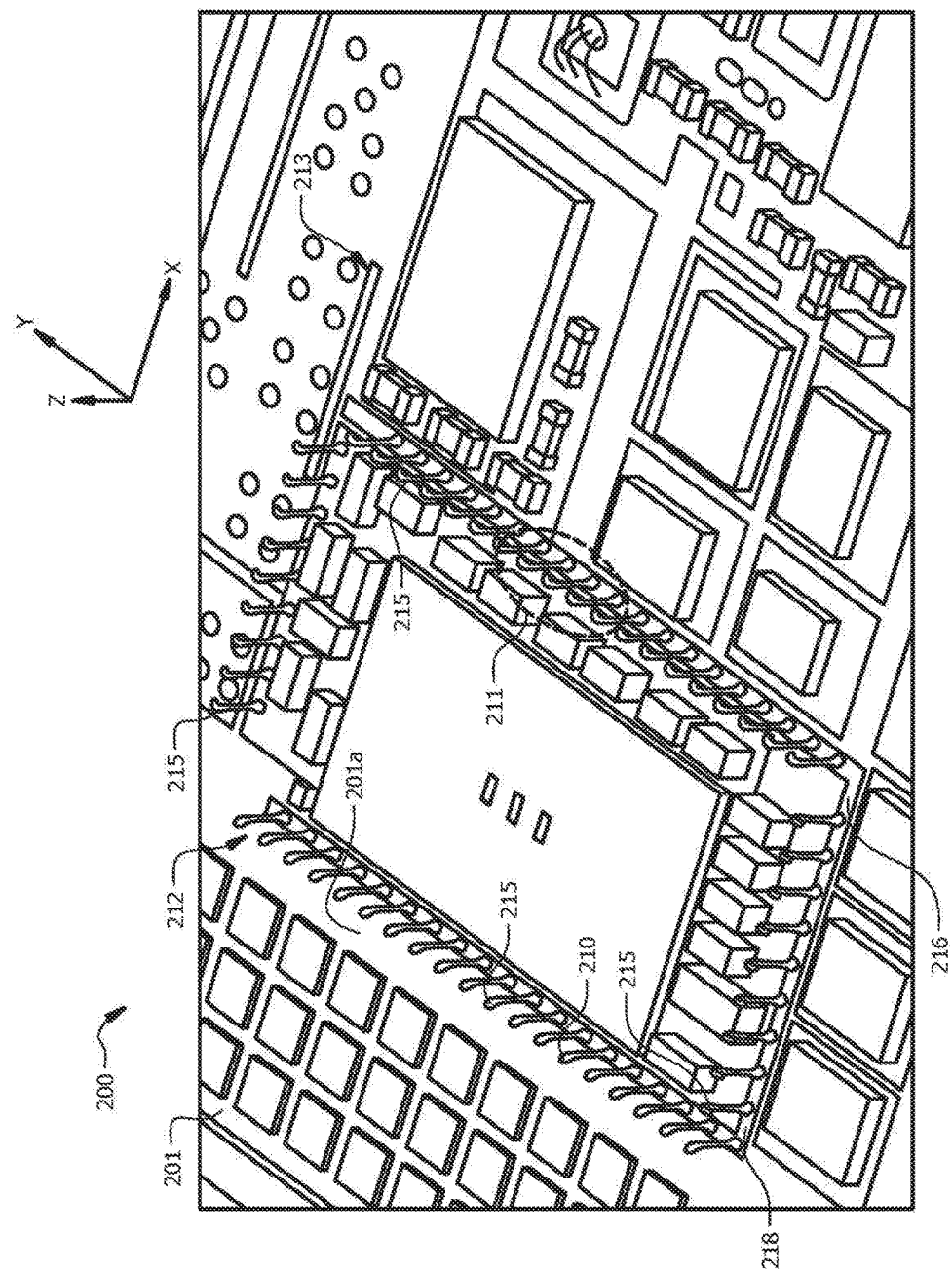
FIG. 9A illustrates a top perspective view of a portion of a system module package surrounded by a compartment EMI shield in accordance with another representative embodiment.
Figure 9B:
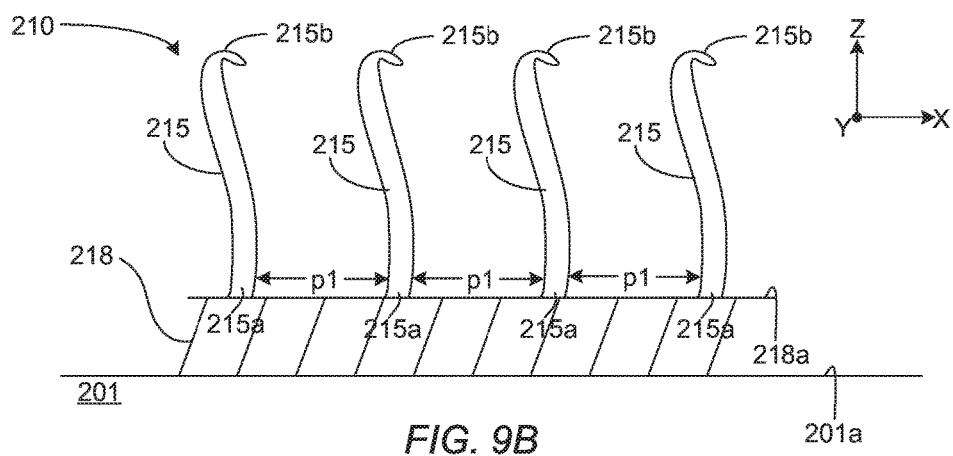
FIG. 9B illustrates a side enlarged view of a portion of the compartment EMI shield shown in FIG. 9A.

FIG. 9A illustrates a top perspective view of a portion of a system module package 200 having a compartment EMI shield 210 in accordance with a representative embodiment. In the representative embodiment shown in FIG. 9A, the EMC and the top assembly EMI shield have not yet been formed in order to allow the configuration of the compartment EMI shield 210 to be seen. FIG. 9B illustrates a side enlarged view of the portion of the compartment EMI shield 210 shown in the dashed circle 211 in FIG. 9A. In accordance with this representative embodiment, the first and second sets of electrical components 212 and 213, respectively, comprise first and second pluralities of electrical components, respectively.

The compartment EMI shield 210 comprises a plurality of substantially vertical conductive structures 215 arranged along a compartment boundary 216 that defines a first compartment and comprising a fence that extends at least in between the first and second sets of electrical components 212 and 213, respectively. In accordance with this embodiment, the fence extends about the entire first set of electrical components 212. First ends 215a (FIG. 9B) of adjacent the plurality of substantially vertical conductive structures 215 are spaced apart from one another by a pitch, p1, (FIG. 9B) that is preselected to ensure that the compartment EMI shield 210 attenuates EMI of a frequency of interest traveling from the first set of electrical components 212 toward the second set of electrical components 213, and vice versa. The first ends 215a are mechanically coupled to the top surface 201a of the substrate 201 via the common electrical ground structure 218. The first ends 215a are mechanically and electrically coupled to the common electrical ground structure 218.

In accordance with this embodiment, the compartment boundary 216 coincides with a common electrical ground structure 218 that is substantially rectangular in shape and that has a top surface 218a (FIG. 9B) that is substantially parallel to a top surface 201a of a substrate 201 of the system module package 200. The common electrical ground structure 218 is a conductive strip that extends about the periphery of the first set of electrical components 212 and that is spaced apart in the X- and Y-directions from the electrical components of the first set of electrical components 212 by a preselected distance. The plurality of substantially vertical conductive structures 215 are substantially normal to the top surface 201a of the substrate 201 and are of substantially equal lengths measured from the top surface 201a of the substrate in a direction substantially normal to the top surface 201a of the substrate 201.

The plurality of substantially vertical conductive structures 215 are not perfectly vertical due to the use of the vertical wire bonding process by which they are made. The plurality of substantially vertical conductive structures 215 have first ends 215a that are electrically and mechanically coupled to the common electrical ground structure 218 and second ends 215b that are spaced apart a predetermined distance from the respective first ends 215a in the Z-direction. The plurality of substantially vertical conductive structures 215 are "substantially vertical" in that the highest point on each structure 215 is at a height, H, from the top surface 201a of the substrate 201 measured in a direction substantially normal (Z-direction) to the top surface 201a of the substrate 201 that is at least twice as great as the lateral distance, $D_L$, of the highest point from a center of the first end 215a of the structure 215 measured in a direction substantially parallel to the top surface 201a of the substrate 201, as will be described below in more detail with reference to FIG. 17. Each of the second ends 215b comprises a tail portion that has the narrowest width of any other portion of the respective substantially vertical conductive structure 215. The tail portions may be formed during a process of clipping the vertical bond wires to provide them with similar or equal lengths (Z-direction). While the tail portions are shown in FIG. 9B as facing in the same direction, they may face in different directions. The tail portions may face inwardly, outwardly and/or laterally relative to the first set of electrical components 212.

The first ends 215a of the plurality of substantially vertical conductive structures 215 may be directly electrically and mechanically connected to the common electrical ground structure 218 or they may be directly connected to respective electrical bond pads (not shown) of the type that are normally used in wire bonding processes. In the latter case, the electrical bond pads electrically and mechanically couple the first ends 215a to the common electrical ground structure 218.

Figure 10A:
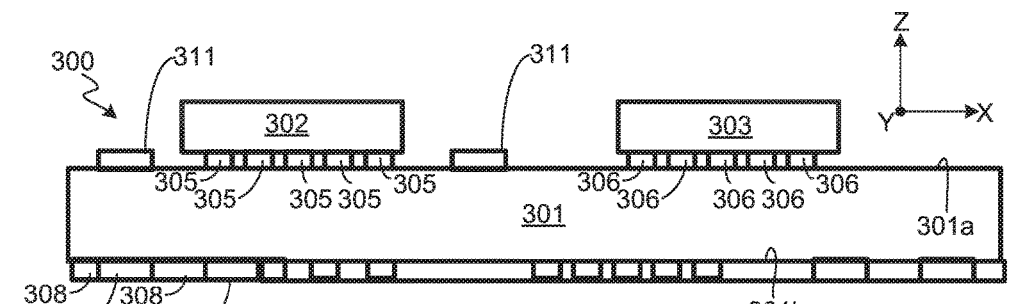
FIG. 10A-10D illustrate side views of a portion of a system module package during various stages of forming a compartment EMI shield therein in accordance with a representative embodiment.

FIGS. 10A-10D illustrate side views of a portion of a system module package 300 during various stages of forming a compartment EMI shield therein in accordance with a representative embodiment. FIG. 10A depicts a substrate 301 of the system module package 300 having a top surface 301a on which first and second electrical components 302 and 303, respectively, of first and second sets of electrical components, respectively, are mounted using a known SMT process. The first and second sets of electrical components include the first and second electrical components 302 and 303, respectively, but may also include additional components, such as additional passive or active electrical or electronic components, for example.

During the SMT process, the first and second electrical components 302 and 303, respectively, are mounted at preselected locations on the top surface 301a of the substrate 301 and a solder reflow process is performed to form electrical bonds between respective sets of electrical contacts disposed on the top surface 301a of the substrate 301 and first and second sets of electrical connection elements 305 and 306, respectively (e.g., solder balls). The first and second sets of electrical connection elements 305 and 306, respectively, are in contact with respective electrical contacts of the first and second electrical components 302 and 303, respectively. Prior to the SMT processes being performed, electrical contacts 307 and a solder mask 308 are typically formed on the bottom surface 301b of the substrate 301. The solder mask 308 comprises dielectric material that is disposed in between the electrical contacts 307.

As part of the SMT process or as part of a separate process, a common electrical ground structure 311 is formed in or on the substrate 301. The common electrical ground structure 311 is shown in FIGS. 10A-10D as being disposed on the top surface 301a of the substrate 301, but it could instead be disposed beneath the top surface 301a of the substrate 301, or partially above and partially beneath the top surface 301a of the substrate 301.

Figure 10B:
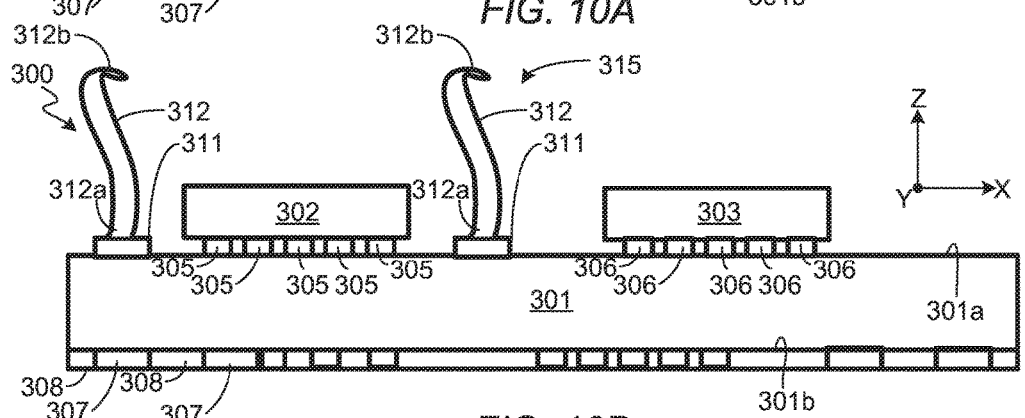

FIG. 10B depicts the portion of the system module package 300 shown in FIG. 10A after a fence comprising substantially vertical conductive structures 312 has been formed along a compartment boundary that defines a first compartment in which the first electrical component 302 is mounted. For clarity, the substantially vertical conductive structures 312 shown in FIGS. 10B and 10C are disposed on two opposite sides of the first electrical component 302, but the fence comprising the substantially vertical conductive structures 312 may be disposed adjacent a single side of the first electrical component 302 in between the first and second electrical components 302 and 303, respectively, or it may extend about the entirety of the first electrical component 302 such that it is adjacent all four sides of the first electrical component 302 and is spaced apart from it a preselected distance in the X- and Y-directions of the X, Y, Z Cartesian coordinate system.

The substantially vertical conductive structures 312 have first ends 312a that are mechanically and electrically coupled to the common electrical ground structure 311 and second ends 312b that are disposed a preselected distance above the respective first ends 312a in the Z-direction of the X, Y, Z Cartesian coordinate system shown in FIGS. 10A-10D. The first ends 312a are mechanically coupled to the top surface 301a of the substrate 301 via the common electrical ground structure 311. The top surface 301a of the substrate 301 is substantially planar and is substantially parallel to the X-Y plane of the X, Y, Z Cartesian coordinate system. The substantially vertical conductive structures 312 are substantially parallel to the Z-axis. The substantially vertical conductive structures 312 have the same characteristics as the substantially vertical conductive structures 112 shown in FIGS. 8A-8C and 9B.

In accordance with a preferred embodiment, the fence comprising the substantially vertical conductive structures 312 does not pass over the top of the first electrical component 302. Reference numeral 315 represents the compartment EMI shield, which comprises the substantially vertical conductive structures 312 mechanically and electrically coupled on their first ends 312a to the common electrical ground structure 311. Because the compartment EMI shield 315 does not pass over the top of the first electrical component 302, there is no risk of the substantially vertical conductive structures 312 coming into contact with the first electrical component 302. This feature also allows the substantially vertical conductive structures 312 to be placed closer to the first electrical component 302 in the X- and Y-directions and to be relatively short in height, i.e., in the Z-direction, which, in turn, allows the compartment EMI shield 315 to be used in system module packages that have thin form factors (thin in the Z-dimension), that have short lengths (X-dimension) and that have short widths (Y-dimension).

Figure 10C:
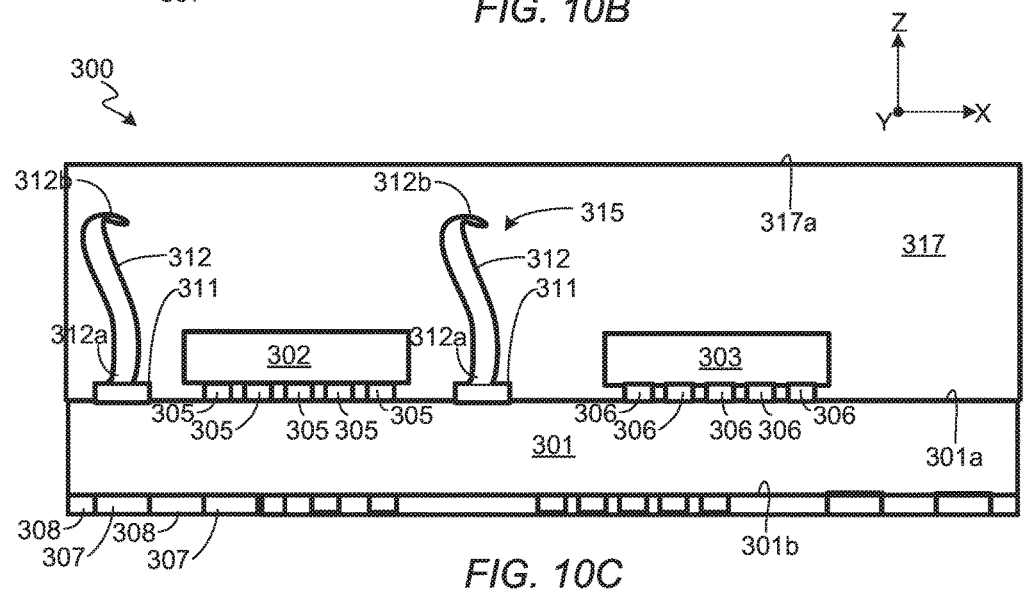

With reference to FIG. 10C, after the SMT process has been completed and the compartment EMI shield 115 has been formed, e.g., via a wire bonding process, an EMC 317 is formed on the top surface 301a of the substrate 301 to encapsulate the components that are mounted on the top surface 301a, including the first and second electrical components 302 and 303, respectively, and the compartment EMI shield 315. At this point in the process, a top surface 317a of the EMC 317 is separated by a gap from the second ends 312b of the substantially vertical conductive structures 312.

Figure 10D:
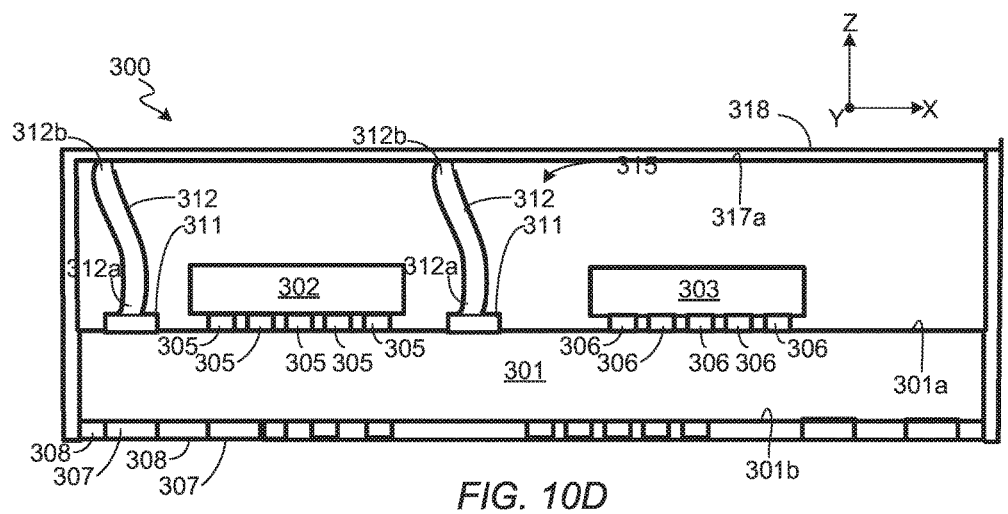

With reference to FIG. 10D, a strip grinding process is performed to thin the EMC 317 to eliminate the gap such that the second ends 312b of the substantially vertical conductive structures 312 are exposed through the top surface 317a of the EMC 317. A top assembly EMI shield 318 is formed on the top surface 317a of the EMC 317. In accordance with this representative embodiment, the top assembly EMI shield 318 is in direct contact with the second ends 312b of the substantially vertical conductive structures 312. This obviates the need to electrically couple the top assembly EMI shield 318 to the common electrical ground structure 311.

In accordance with a representative embodiment, the substantially vertical conductive structures 312 are bond wires formed during a wire bonding process. The process of assembling the system module package 300 is typically as follows. Wafer-level semiconductor fabrication processes are used to form the substrate 301 having the electrical contacts 307 and the solder mask 308 formed on the bottom surface 301b thereof. The aforementioned SMT process is then performed. A vertical wire bonding process is then performed to form the compartment EMI shield 315. A molding process is then performed to form the EMC 317 that encapsulates the first and second electrical components 302 and 303, respectively, and the compartment EMI shield 315. The strip grinding process is then performed to expose the second ends 312b of the compartment EMI shield 315 through the top surface 317a of the EMC 317. The top assembly EMI shield 318 is then formed on the top surface 317a of the EMC 317.

Figure 11A:
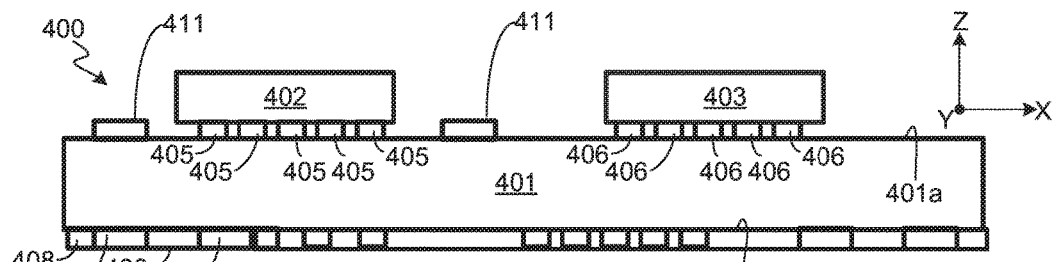
FIGS. 11A-11D illustrate side views of a portion of a system module package during various stages of forming a compartment EMI shield therein in accordance with another representative embodiment.

FIGS. 11A-11D illustrate side views of a portion of a system module package 400 during various stages of forming a compartment EMI shield therein in accordance with another representative embodiment. If there is sufficient space in the X- and Y-directions to form bond wires that extend over the first set of electrical components without coming into contact with them, a typical wire bonding process can be used to create the compartment EMI shield, as will now be described with reference to FIGS. 11A-11D. FIG. 11A depicts a substrate 401 of the system module package 400 having a top surface 401a on which first and second electrical components 402 and 403, respectively, of first and second sets of electrical components, respectively, are mounted using a known SMT process. The first and second sets of electrical components include the first and second electrical components 402 and 403, respectively, but may also include additional components, such as additional passive or active electrical or electronic components, for example.

During the SMT process, the first and second electrical components 402 and 403, respectively, are mounted at preselected locations on the top surface 401a of the substrate 401 and a solder reflow process is performed to form electrical bonds between respective sets of electrical contacts disposed on the top surface 401a of the substrate 401 and first and second sets of electrical connection elements 405 and 406, respectively (e.g., solder balls). The first and second sets of electrical connection elements 405 and 406, respectively, are in contact with respective electrical contacts of the first and second electrical components 402 and 403, respectively. Prior to the SMT processes being performed, electrical contacts 407 and a solder mask 408 are typically formed on the bottom surface 401b of the substrate 401. The solder mask 408 comprises dielectric material that is disposed in between the electrical contacts 407.

As part of the SMT process or as part of a separate process, a common electrical ground structure 411 is formed in or on the substrate 401. The common electrical ground structure 411 is shown in FIGS. 11A-11D as being disposed on the top surface 401a of the substrate 401, but it could instead be disposed beneath the top surface 401a of the substrate 401, or partially above and partially beneath the top surface 401a of the substrate 401.

Figure 11B:
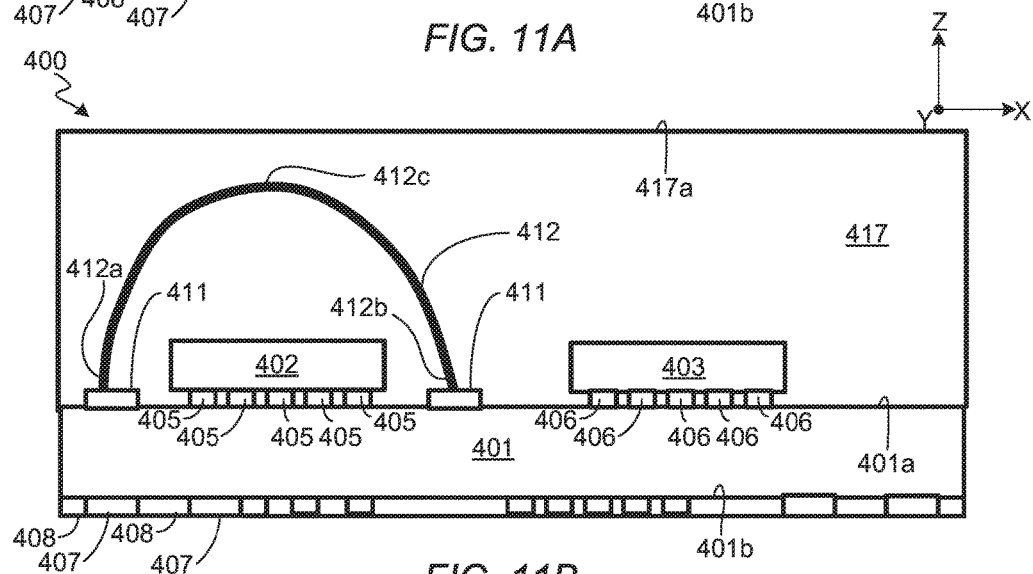

FIG. 11B depicts the portion of the system module package 400 shown in FIG. 11A after a fence comprising a plurality of bond wires 412 has been formed along a compartment boundary that defines a first compartment of the first electrical component 402. The fence comprising the plurality of bond wires 412 will ultimately become the compartment EMI shield. The bond wires 412 are typically formed via a known wire bonding process that is performed after the SMT process has been performed. In accordance with this representative embodiment, the bond wires 412 have first ends 412a and second ends 412b that are electrically coupled to the common electrical ground structure 411 adjacent first and second sides, respectively, of the first electrical component 402 that are opposite one another. The first ends 412a are mechanically coupled to the top surface 401a of the substrate 401 via the common electrical ground structure 411.

Although a single bond wire 412 is visible in the side view shown in FIG. 11B, there is typically a first plurality of the bond wires 412 having first ends 412a and second ends 412b that are electrically coupled to the common electrical ground structure 411 adjacent the first and second sides, respectively, of the first electrical component 402. There may also be a second plurality of the bond wires (not shown) having first and second ends that are electrically coupled to the common electrical ground structure 411 adjacent the third and fourth sides, respectively, of the first electrical component 402 that are opposite one another. In between the first ends 412a and the second ends 412b of the bond wires 412 are middle portions 412c that extend over the first electrical component 402.

Figure 11C:
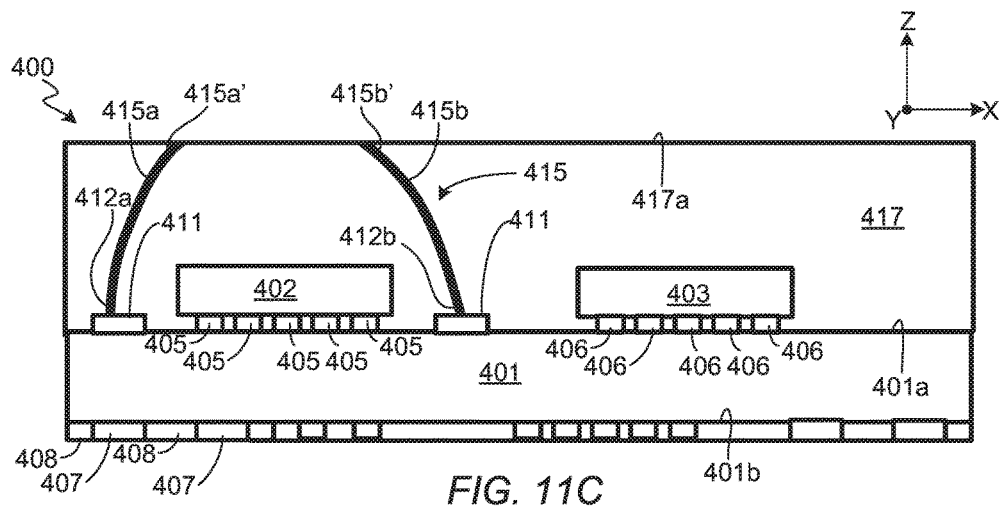

After the SMT and wire bonding processes have been performed, an EMC 417 is formed to encapsulate the first and second components 402 and 403, respectively, and the bond wires 412. The EMC 417 has a top surface 417a that is separated from the bond wires 412 by a gap, as seen in FIG. 11B. With reference to FIG. 11C, a strip grinding process is performed to thin the EMC 417 to eliminate the gap and to almost entirely eliminate the middle portions 412c of the bond wires 412. In essence, each of the plurality of bond wires 412 is divided by the strip grinding process into first and second substantially vertical conductive structures 415a and 415b, respectively, which comprise the compartment EMI shield. Upper ends 415a' and 415b' of the first and second substantially vertical conductive structures 415a and 415b, respectively, are exposed through the top surface 417a of the EMC 416.

Figure 11D:
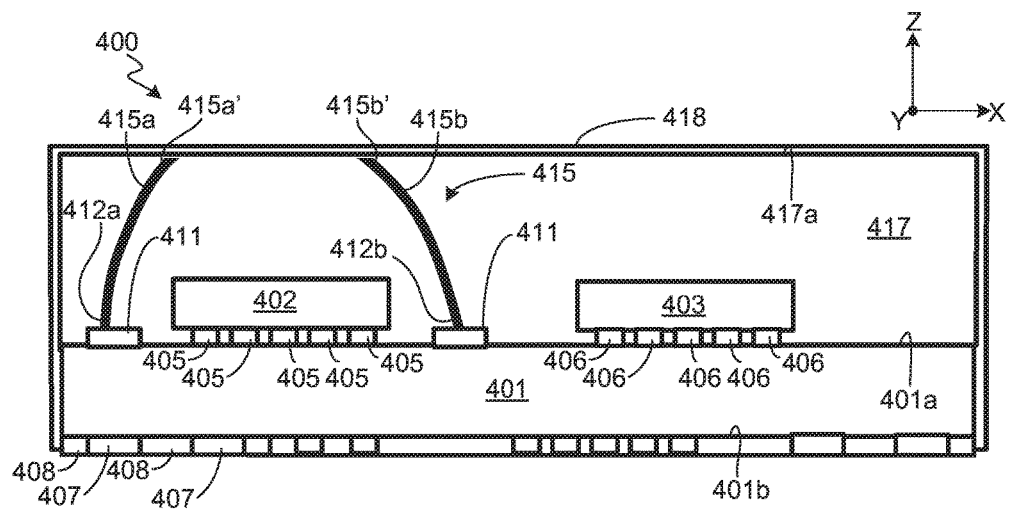

With reference to FIG. 11D, a top assembly EMI shield 418 is formed on the top surface 417a of the EMC 417. In accordance with this representative embodiment, the top assembly EMI shield 418 is in direct contact with the upper ends 415a' and 415b' of the substantially vertical conductive structures 415. This obviates the need to electrically couple the top assembly EMI shield 418 to the common electrical ground structure 411. Thus, the thinning of the EMC 417 and the elimination of the bond wires 412 in the thinned region of the EMC 417 reduces the overall thickness (Z-dimension) of the system module package 400 to enable thinner package form factors to be achieved.

The process of assembling the system module package 400 is typically as follows. Wafer-level semiconductor fabrication processes are used to form the substrate 401 having the electrical contacts 407 and the solder mask 408 formed on the bottom surface 401b thereof. The aforementioned SMT process is then performed. A wire bonding process is then performed to form the bond wires 412 that comprise the compartment EMI shield. A molding process is then performed to form the EMC 417 that encapsulates the first and second electrical components 402 and 403, respectively, and the compartment EMI shield 415. The strip grinding process is then performed to expose the upper ends 415a' and 415b' of the first and second substantially vertical conductive structures 415a and 415b, respectively. The top assembly EMI shield 418 is then formed on the top surface 417a of the EMC 417.

It should be noted that although the substantially vertical conductive structures 415a and 415b are described above as being formed of bond wires, they may be formed of other conductive materials and by processes other than wire bonding.

Figure 12A:
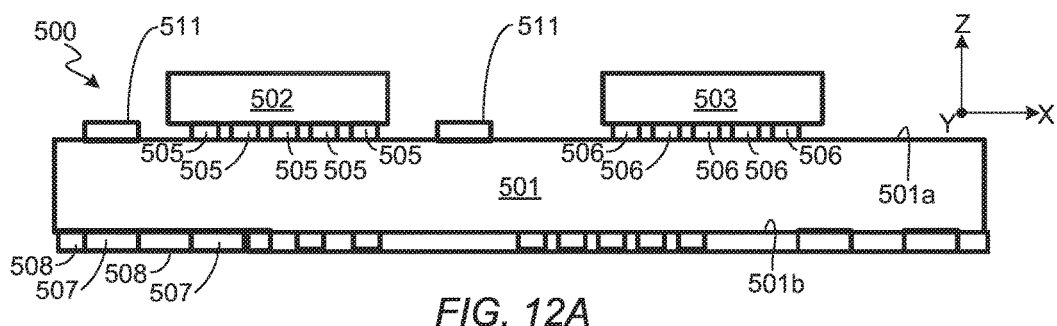
FIGS. 12A-12C illustrate side views of a portion of a system module package during various stages of forming a compartment EMI shield therein in accordance with another representative embodiment.
Figure 12B:
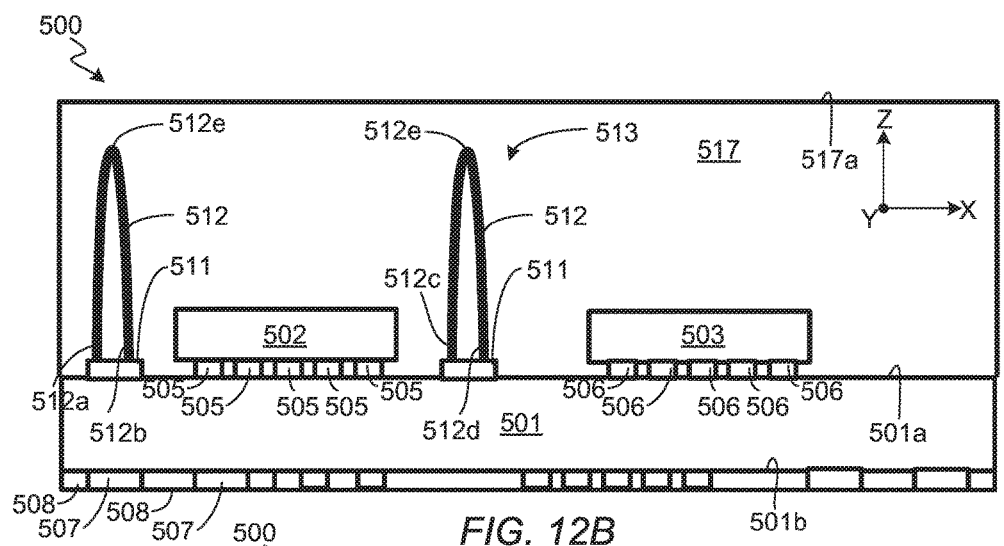
Figure 12C:
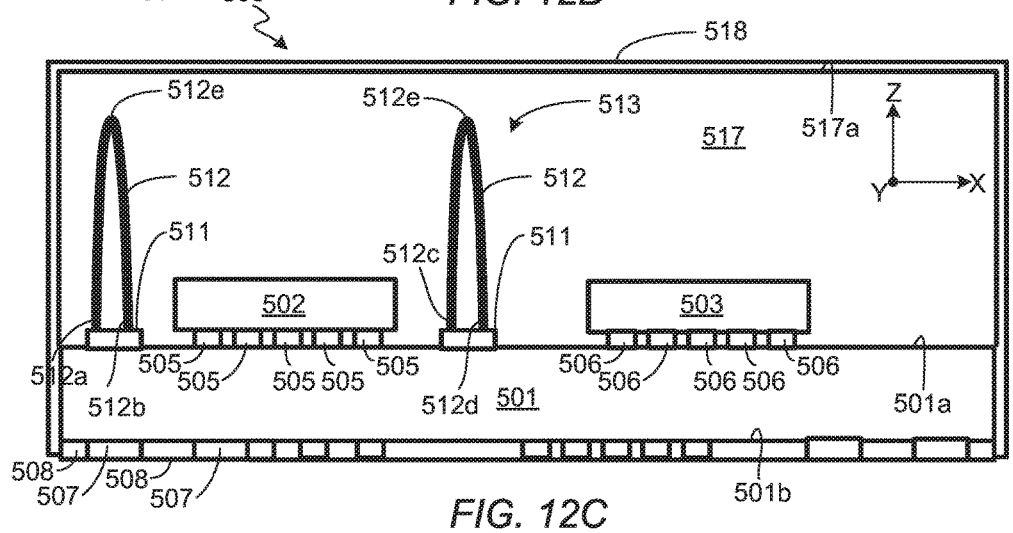

FIGS. 12A-12C illustrate side views of a portion of a system module package 500 during various stages of forming a compartment EMI shield therein in accordance with another representative embodiment. In accordance with this representative embodiment, a wire bonding process is used to create the compartment EMI shield, as will now be described with reference to FIGS. 12A-12C. FIG. 12A depicts a substrate 501 of the system module package 500 having a top surface 501a on which first and second electrical components 502 and 503, respectively, of first and second sets of electrical components, respectively, are mounted using a known SMT process. The first and second sets of electrical components include the first and second electrical components 502 and 503, respectively, but may also include additional components, such as additional passive or active electrical or electronic components, for example.

During the SMT process, the first and second electrical components 502 and 503, respectively, are mounted at preselected locations on the top surface 501a of the substrate 501 and a solder reflow process is performed to form electrical bonds between respective sets of electrical contacts disposed on the top surface 501a of the substrate 501 and first and second sets of electrical connection elements 505 and 506, respectively (e.g., solder balls). The first and second sets of electrical connection elements 505 and 506, respectively, are in contact with respective electrical contacts of the first and second electrical components 502 and 503, respectively. Prior to the SMT processes being performed, electrical contacts 507 and a solder mask 508 are typically formed on the bottom surface 501b of the substrate 501. The solder mask 508 comprises dielectric material that is disposed in between the electrical contacts 507.

As part of the SMT process or as part of a separate process, a common electrical ground structure 511 is formed in or on the substrate 501. The common electrical ground structure 511 is shown in FIGS. 12A-12C as being disposed on the top surface 501a of the substrate 501, but it could instead be disposed beneath the top surface 501a of the substrate 501, or partially above and partially beneath the top surface 501a of the substrate 501.

FIG. 12B depicts the portion of the system module package 500 shown in FIG. 12A after a fence comprising a plurality of substantially vertical conductive structures 512 has been formed along a compartment boundary that defines a first compartment in which the first electrical component 502 is mounted. The fence comprising the plurality of substantially vertical conductive structures 512 electrically coupled to the common electrical ground structure 511 is the compartment EMI shield 513. In accordance with this representative embodiment, the substantially vertical conductive structures 512 are bond wires formed via a known wire bonding process after the SMT process has been performed.

In accordance with this representative embodiment, a first set of the bond wires comprising the substantially vertical conductive structures 512 have first ends 512a and second ends 512b that are electrically coupled to the common electrical ground structure 511 adjacent a first side of the first electrical component 502. The first ends 512a and the second ends 512b are mechanically coupled to the top surface 501a of the substrate 501 via the common electrical ground structure 511. In accordance with this representative embodiment, a second set of the bond wires comprising the substantially vertical conductive structures 512 have first ends 512c and second ends 512d that are electrically coupled to the common electrical ground structure 511 adjacent a second side of the first electrical component 502. In similar manner, additional sets of the bond wires that are not shown for clarity may be included in the compartment EMI shield 513 along third and fourth sides of the first electrical component 502 that are opposite one another and perpendicular to the first and second sides of the first electrical component 502.

After the SMT and wire bonding processes have been performed, an EMC 517 is formed to encapsulate the first and second components 502 and 503, respectively, and the substantially vertical conductive structures 512. The EMC 517 has a top surface 517a that is separated from middle portions 512e of the substantially vertical conductive structures 512 by a gap, as seen in FIG. 12B. The middle portions 512e are portions of the substantially vertical conductive structures 512 that are farthest from the top surface 501a of the substrate 501 measured in the Z-direction (i.e., normal to the top surface 501a).

With reference to FIG. 12C, a top assembly EMI shield 518 is formed on the top surface 517a of the EMC 517. In accordance with this representative embodiment, the top assembly EMI shield 518 is not in direct contact with the middle portions 512e of the substantially vertical conductive structures 512, but is spaced apart from them by a preselected distance that is preselected based on a frequency of interest that the compartment EMI shield 513 is intended to attenuate. The top assembly EMI shield 518 is electrically coupled to the common electrical ground structure 511.

The process of assembling the system module package 500 is typically as follows. Wafer-level semiconductor fabrication processes are used to form the substrate 501 having the electrical contacts 507 and the solder mask 508 formed on the bottom surface 501b thereof. The aforementioned SMT process is then performed. A wire bonding process is then performed to form the bond wires comprising the substantially vertical conductive structures 512. A molding process is then performed to form the EMC 517 that encapsulates the first and second electrical components 502 and 503, respectively, and the compartment EMI shield 513. The top assembly EMI shield 518 is then formed on the top surface 517a of the EMC 517.

Figure 13A:
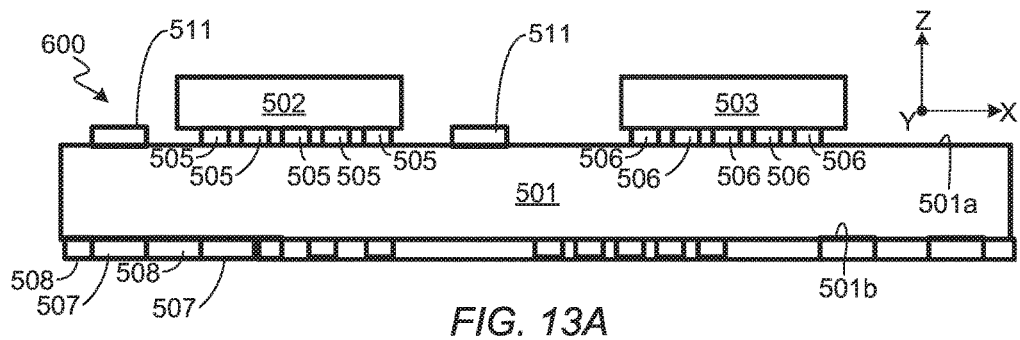
FIGS. 13A-13C illustrate side views of a portion of a system module package during various stages of forming a compartment EMI shield therein in accordance with another representative embodiment.
Figure 13B:
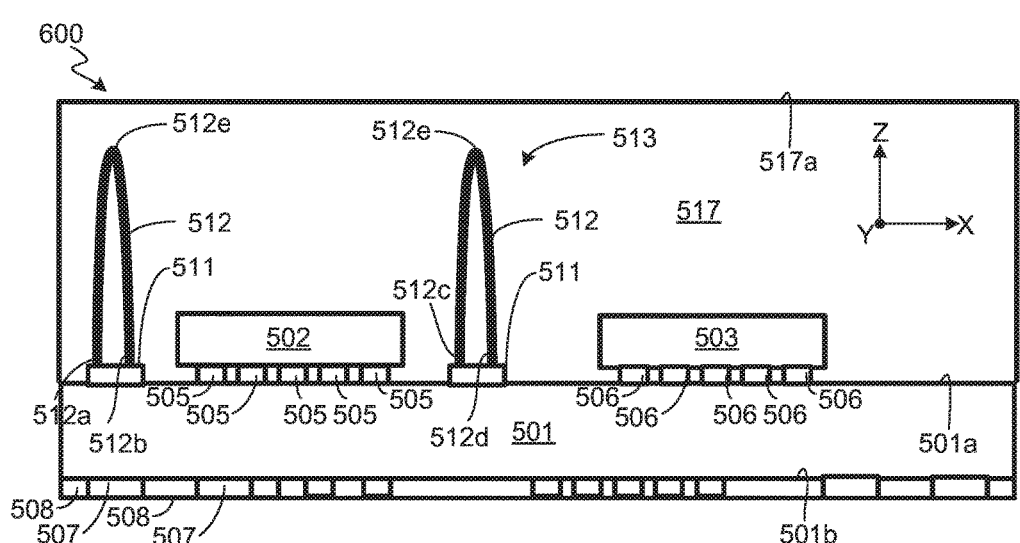
Figure 13C:
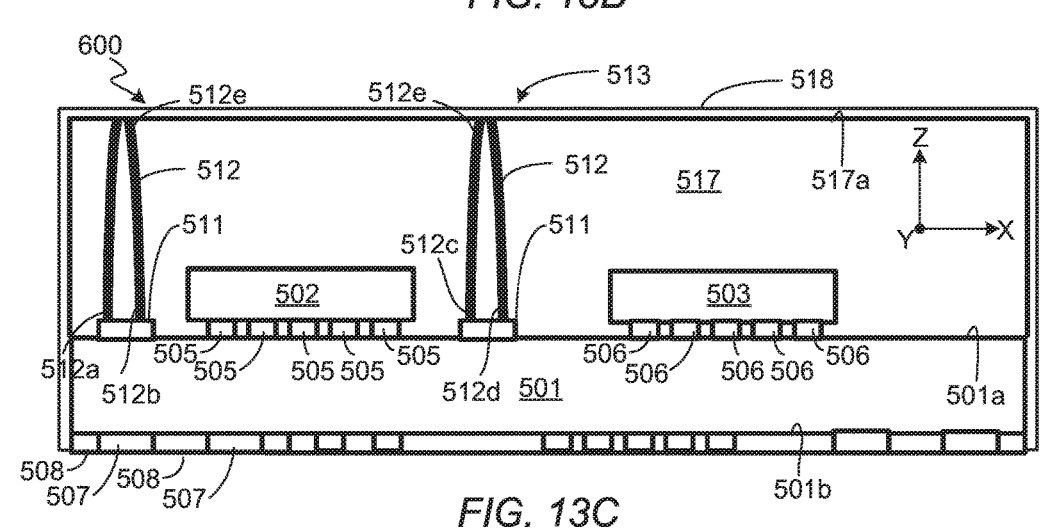

FIGS. 13A-13C illustrate side views of a portion of a system module package 600 during various stages of forming a compartment EMI shield therein in accordance with another representative embodiment. The system module package 600 shown in FIGS. 13A-13C is substantially similar to the system module package 500 shown in FIGS. 12A-12C but differs at least in that the EMC 517 of the system module package 600 shown in FIG. 13B has been thinned via the aforementioned strip grinding process to expose the middle portions 512e of the substantially vertical conductive structures 512 before the top assembly EMI shield 518 is formed on the top surface 517a of the EMC 517.

Figure 14:
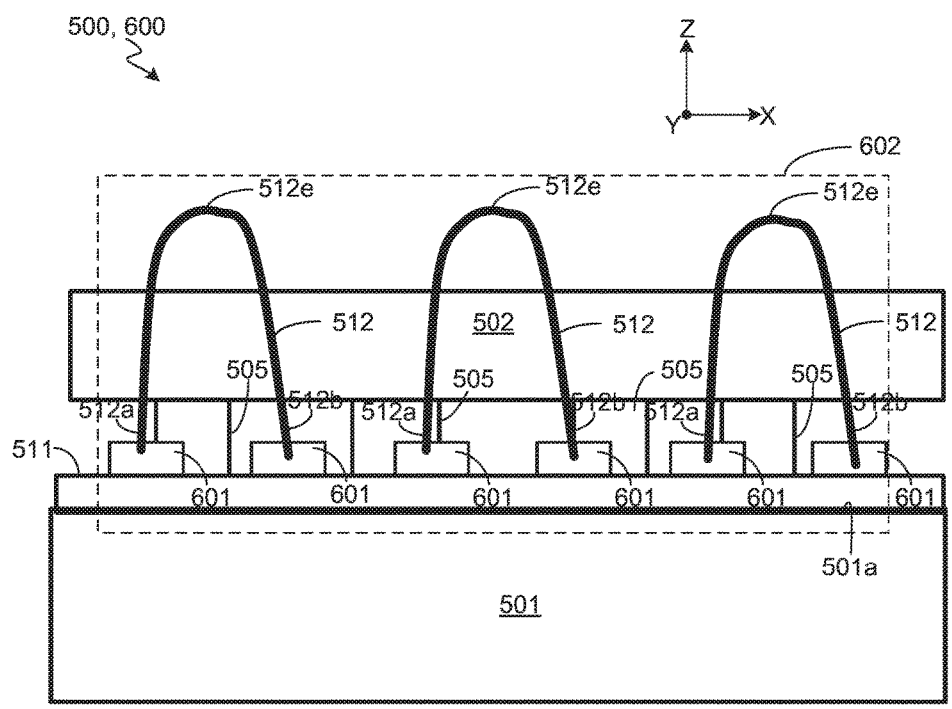
FIG. 14 illustrates an end view of the system module packages shown in FIGS. 12B and 13B.

FIG. 14 illustrates an end view of the system module packages 500 and 600 shown in FIGS. 12B and 13B, respectively, which shows the first set of the bond wires comprising the substantially vertical conductive structures 512 have first ends 512a and second ends 512b that are electrically coupled to the common electrical ground structure 511 adjacent the first side of the first electrical component 502. The first and second ends 512a and 512b, respectively, may be directly connected to the common electrical ground structure 511 or they may be directly connected to electrical bond pads, which are directly connected to the common electrical ground structure 511. In FIG. 14, the first and second ends 512a and 512b, respectively, are shown directly connected to electrical bond pads 601, which are directly connected to the common electrical ground structure 511. In accordance with this representative embodiment, the first set of bond wires comprising the substantially vertical conductive structures 512 lie in a fence plane 602 that is substantially parallel to the Y-Z plane of the X, Y, Z Cartesian coordinate system and substantially perpendicular to the top surface 501a of the substrate 501.

Figure 15A:
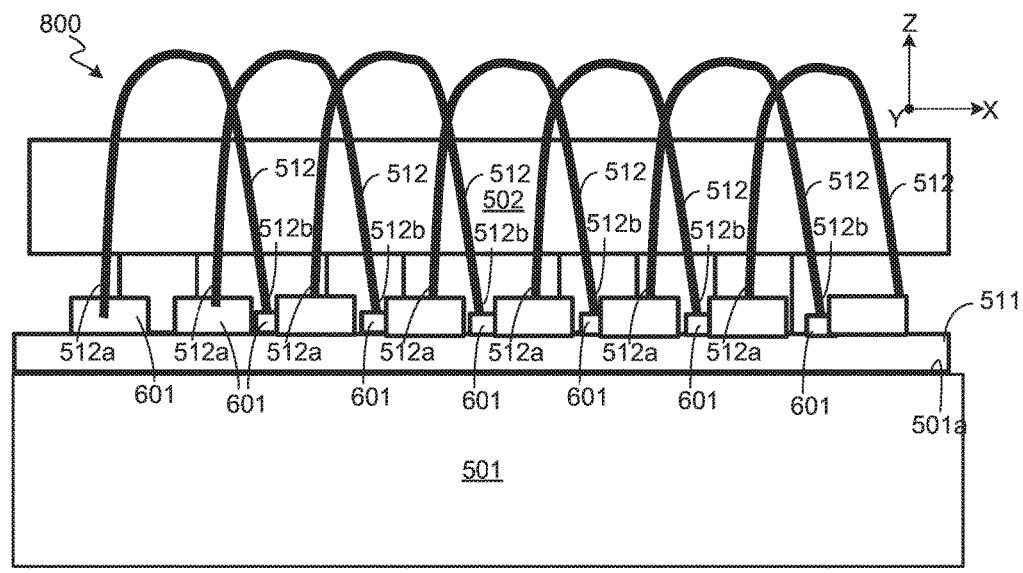
FIGS. 15A and 15B illustrate side and top views, respectively, of a system module package in accordance with another representative embodiment that is substantially similar to the system module packages shown in FIGS. 12B and 13B, respectively, but differs at least in that the substantially vertical conductive structures have first ends that are in a first fence plane and second ends that are in a second fence plane, where the first fence plane and the second fence plane are substantially parallel to one another.
Figure 15B:
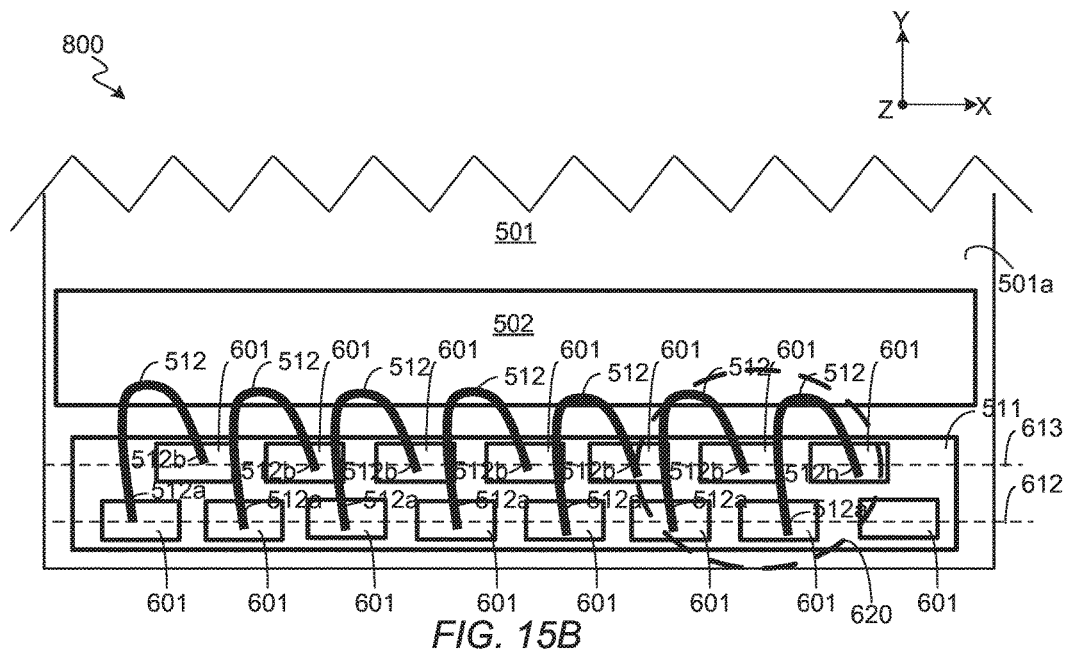

FIGS. 15A and 15B illustrate side and top views, respectively, of the system module package 800 in accordance with another representative embodiment. The system module package 800 is substantially similar to the system module packages 500 and 600 shown in FIGS. 12B and 13B, respectively, but differs at least in that the substantially vertical conductive structures 512 have first ends 512a that lie in a first fence plane 612 and second ends 512b that lie in a second fence plane 613, where the first fence plane 612 and the second fence plane 613 are substantially parallel to one another, substantially parallel to the X-Z plane of the X, Y, Z Cartesian coordinate system and substantially perpendicular to the top surface 501a of the substrate 501. The first and second fence planes 612 and 613, respectively, define a fence region that is in between the first and second fence planes 612 and 613, respectively.

Figure 16:
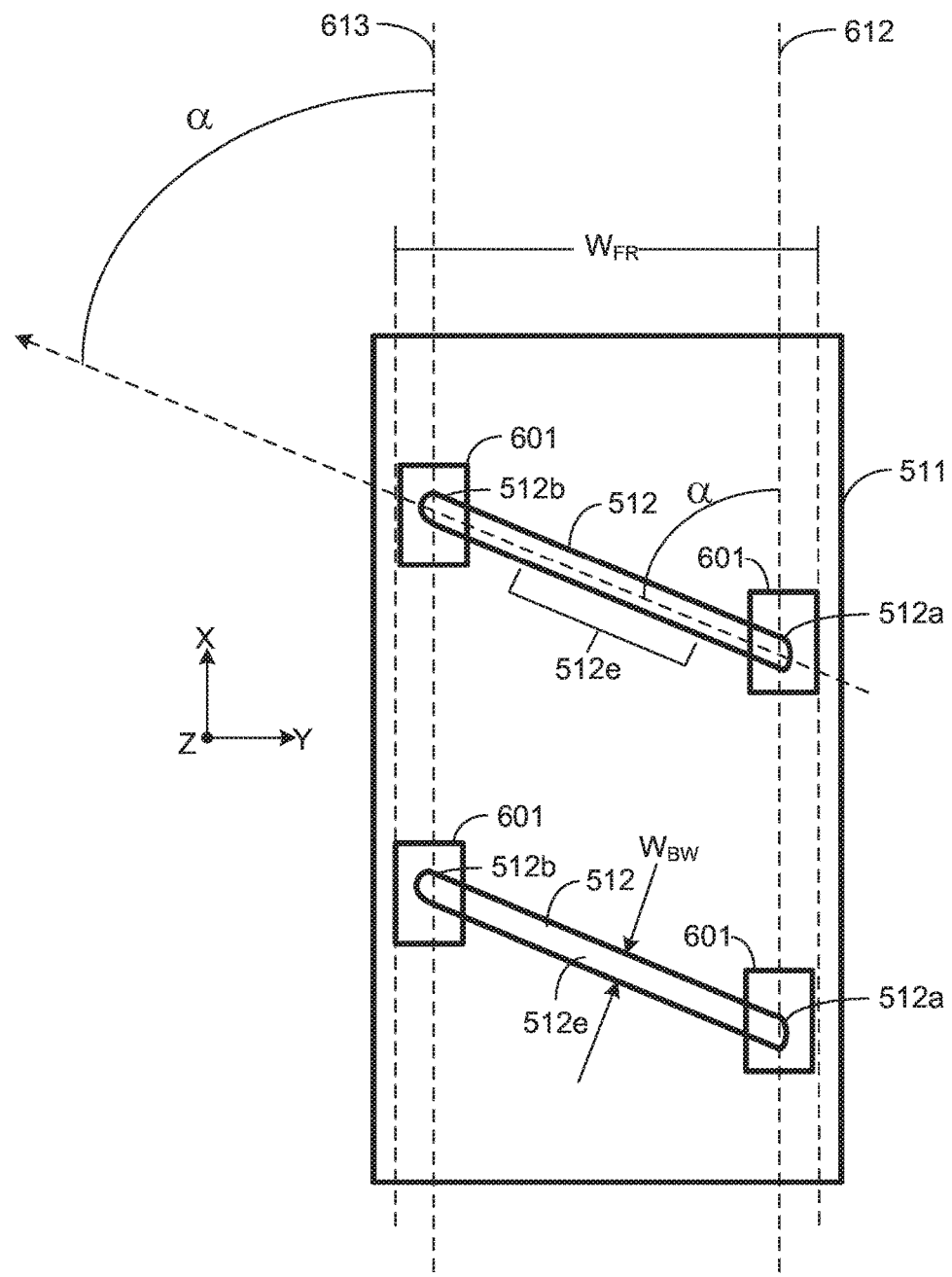
FIG. 16 illustrates a top view of the portion of the system module package shown in the dashed circle labeled with reference numeral 620 in FIG. 15B.

FIG. 16 illustrates a top view of the portion of the system module package 800 shown in the dashed circle labeled with reference numeral 620 in FIG. 15B. The substantially vertical conductive structures 512 have middle portions 512e that are at a preselected, non-zero-degree angle, α, relative to the first and second fence planes 612 and 613, respectively. The preselected, non-zero-degree angle α is typically less than 30°. The distance in the Y-direction between the outside edges of the electrical bond pads 601 that are connected to the first and second ends 512a and 512b, respectively, is the width of the fence region, $W_{FR}$. The substantially vertical conductive structures 512, which are bond wires in accordance with this representative embodiment, having a width, W. The average width of the bond wires, $W_{BW}$, is typically less than twenty micrometers (microns). The width of the fence region, $W_{FR}$, is less than or equal to five times $W_{BW}$.

In accordance with the representative embodiment shown in FIGS. 15A-16, an EMC (not shown) and a top assembly EMI shield (not shown) identical to the EMC 517 and the top assembly EMI shield 518 shown in FIGS. 12B, 12C, 13B and 13C may be used in the system module package 800, in which case the substantially vertical conductive structures 512 may be in direct contact with the top assembly EMI shield 518, as depicted in FIG. 13C, or they may be spaced apart by a gap from the top assembly EMI shield 518, as depicted in FIG. 12C.

It should be noted that when bond wires are used to construct the compartment EMI shields in the various representative embodiments described above, the ends of the bond wires may be directly connected to the common electrical ground structure or they be connected to electric bond pads, which are directly or indirectly connected to the common electrical ground structure. As indicated above, the common electrical ground structure may be disposed above, beneath, partially above, and partially beneath the top surface of the substrate. It should also be noted that a top surface of the common electrical ground structure may be co-planar with the top surface of the substrate. It should also be noted that in embodiments in which the substantially vertical conductive structures are exposed through the top surface of the EMC and are in contact with the top assembly EMI shield, the opposite ends of the substantially vertical conductive structures do not need to be electrically coupled to a common electrical ground structure if the top assembly EMI shield is electrically coupled to an electrical ground structure of the system module package.

Figure 17:
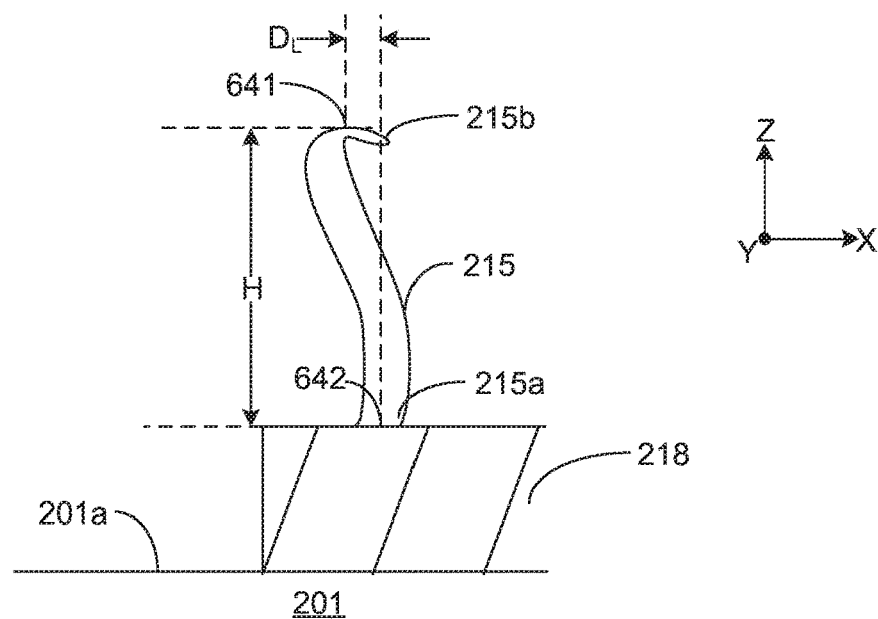
FIG. 17 illustrates a side view of one of the substantially vertical conductive structures shown in FIG. 9B.

FIG. 17 illustrates a side view of one of the plurality of substantially vertical conductive structures 215 shown in FIG. 9B. As indicated above, the plurality of substantially vertical conductive structures 215 are "substantially vertical" in that the highest point 641 on each structure 215 is at a height, H, from the top surface 201a of the substrate 201 measured in a direction substantially normal (Z-direction) to the top surface 201a of the substrate 201 that is at least twice as great as the lateral distance, $D_L$, of the highest point 641 measured in a direction substantially parallel to the top surface 201a of the substrate 201 from a center 642 of the first end 215a of the structure 215.

Figure 18:
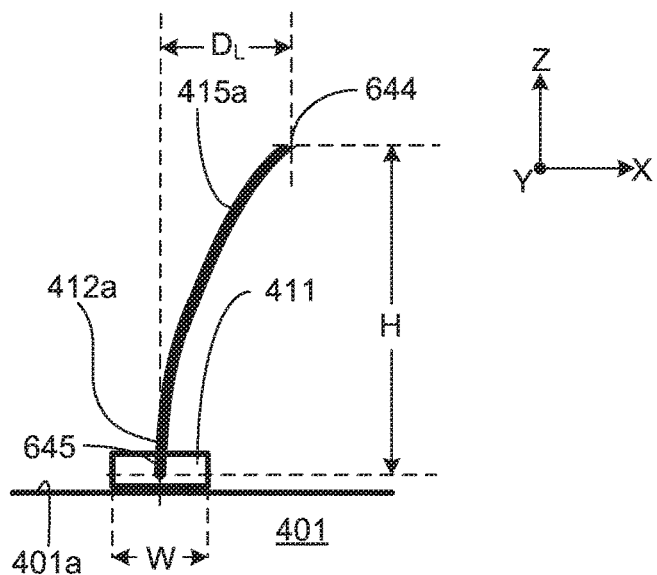
FIG. 18 illustrates a side view of one of the substantially vertical conductive structures shown in FIG. 11C.

FIG. 18 illustrates a side view of one of the substantially vertical conductive structures 415a shown in FIG. 11C. The structures 415a are "substantially vertical" in that the highest point 644 on each structure 415a is at a height, H, from the top surface 401a of the substrate 401 measured in a direction substantially normal (Z-direction) to the top surface 401a of the substrate 401 that is at least twice as great as the lateral distance, $D_L$, of the highest point 644 measured in a direction substantially parallel to the top surface 401a of the substrate 401 from a center 645 of the first end 412a of the structure 415a. The center of the common electrical ground structure 411 is at a point along the X-axis where a plane that is parallel to the Y-Z plane bisects the common electrical ground structure 411. The lateral distance $D_L$, is less than or equal to three times the width, W, of the common electrical ground structure 411, which may be, for example, a conductive strip.

Figure 19:
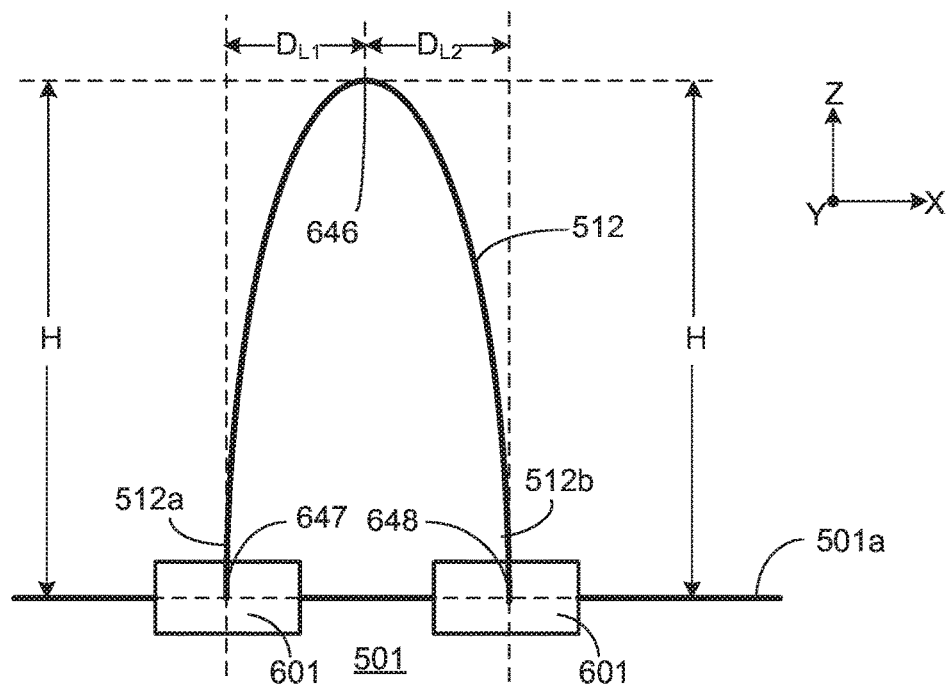
FIG. 19 illustrates a side view of one of the substantially vertical conductive structures shown in FIG. 14.

FIG. 19 illustrates a side view of one of the substantially vertical conductive structures 512 shown in FIG. 14. The substantially vertical conductive structures 512 are "substantially vertical" in that the highest point 646 on each of the substantially vertical conductive structures 512 is at a height, H, from the top surface 501a of the substrate 501 measured in a direction substantially normal (Z-direction) to the top surface 501a of the substrate 501 that is at least twice as great as the lateral distances, $D_{L1}$ and $D_{L2}$, of the highest point 646 from centers 647 and 648, respectively, of the first and second ends 512a and 512b, respectively, of the each of the substantially vertically conductive structures 512 measured in a direction substantially parallel to the top surface 501a of the substrate 501.

Figure 20:
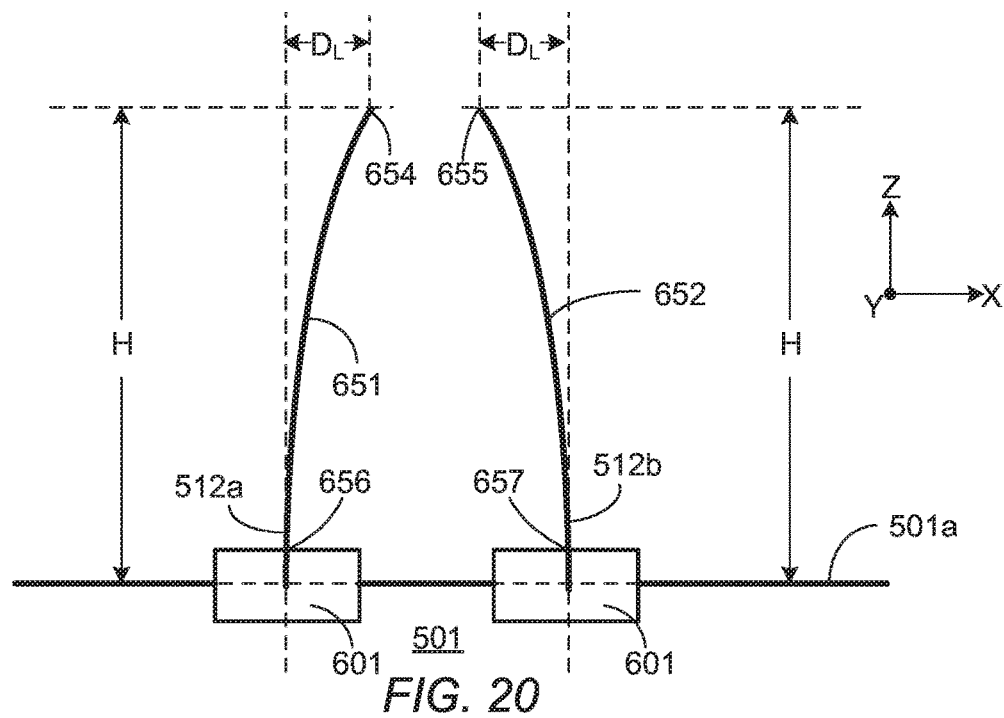
FIG. 20 illustrates a side view of first and second substantially vertical conductive structures after the middle portions of the substantially vertical conductive structures shown in FIG. 14 have been removed via the aforementioned strip grinding process.

FIG. 20 illustrates a side view of first and second substantially vertical conductive structures 651 and 652, respectively, after the middle portions 512e of the substantially vertical conductive structures 512 shown in FIG. 14 have been removed via the aforementioned strip grinding process. The first and second substantially vertical conductive structures 651 and 652 are "substantially vertical" in that the highest points 654 and 655 on each of the first and second substantially vertical conductive structures 651 and 652, respectively, are at a height, H, from the top surface 501a of the substrate 501 measured in a direction substantially normal (Z-direction) to the top surface 501a of the substrate 501 that is at least twice as great as first and second lateral distances, $D_{L1}$ and $D_{L2}$, respectively, of the highest points 654 and 655, respectively, from centers 656 and 657, respectively, of the first and second ends 512a and 512b, respectively, measured in a direction substantially parallel to the top surface 501a of the substrate 501.

Figure 21:
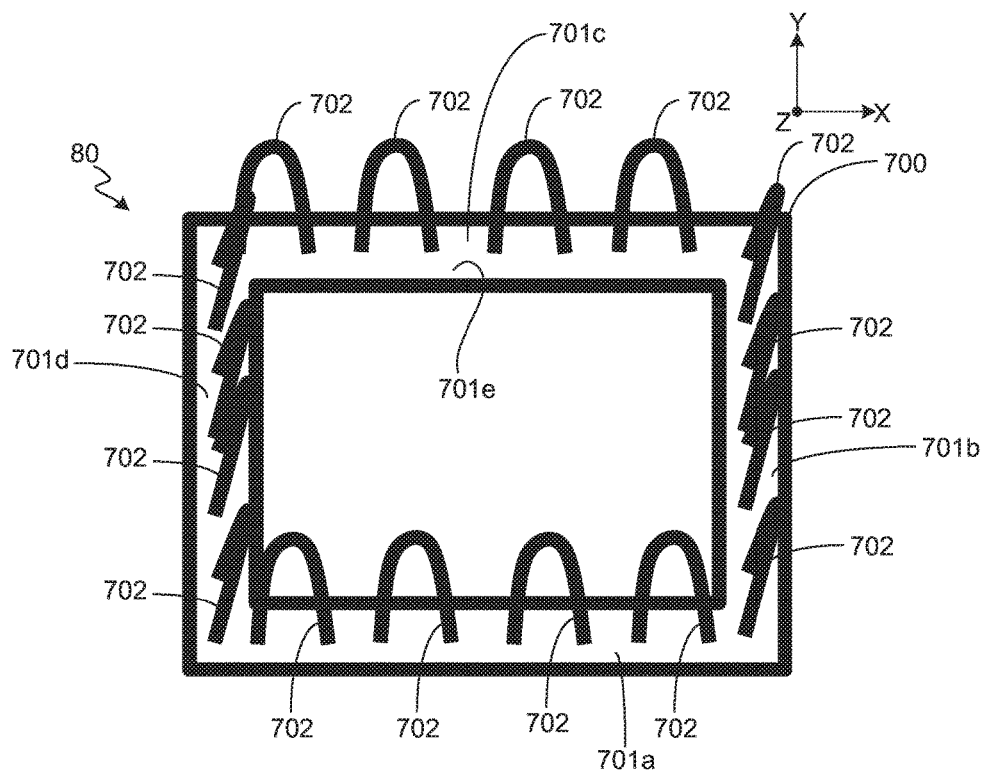
FIG. 21 illustrates a bottom view of the compartment EMI shield shown in FIGS. 5-7 in accordance with a representative embodiment in which the compartment EMI shield comprises a wire cage.
Figure 22A:
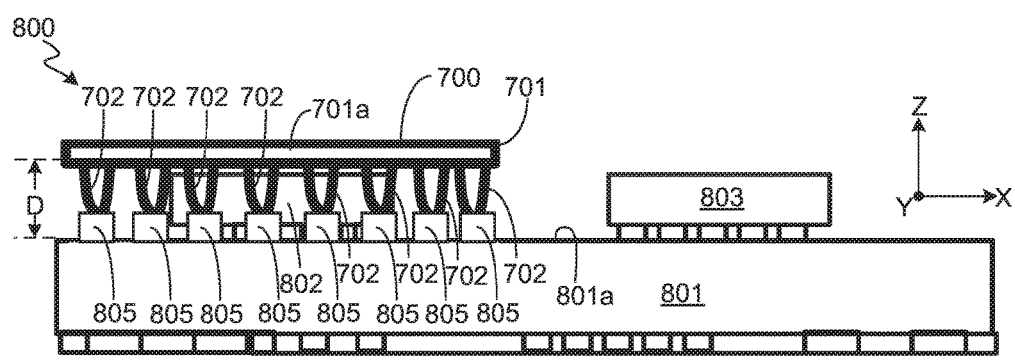
FIG. 22A illustrates a side view of a system module package that incorporates the wire cage shown in FIG. 21.
Figure 22B:
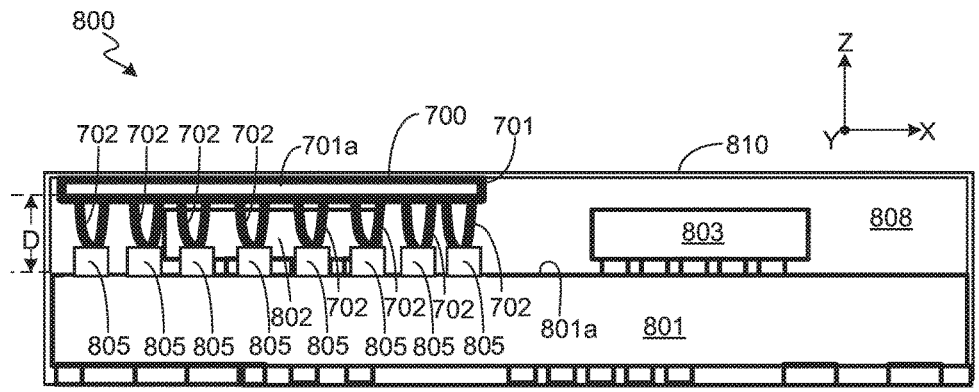
FIG. 22B illustrates a side view of a system module package shown in FIG. 22A that incorporates the wire cage shown in FIG. 21 in accordance with a representative embodiment in which the wire cage is in contact with a top assembly EMI shield of the system module package.
Figure 22C:
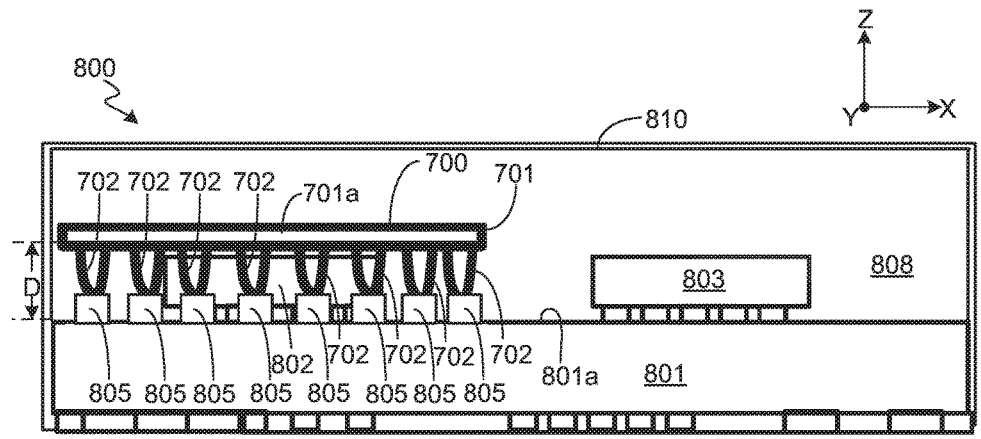
FIG. 22C illustrates a side view of a system module package shown in FIG. 22A that incorporates the wire cage shown in FIG. 21 in accordance with a representative embodiment in which the wire cage is spaced apart from the top assembly EMI shield of the system module package by a preselected distance.

FIG. 21 illustrates a bottom view of the compartment EMI shield 80 shown in FIGS. 5-7 in accordance with a representative embodiment in which the compartment EMI shield 80 comprises a wire cage 700. The wire cage 700 may be a pre-formed structure that is pre-formed and subsequently installed in a system module package. FIG. 22A illustrates a side view of a system module package 800 that incorporates the wire cage 700 shown in FIG. 21. FIG. 22B illustrates a side view of a system module package 800 shown in FIG. 22A that incorporates the wire cage 700 shown in FIG. 21 in accordance with a representative embodiment in which the wire cage 700 is in contact with a top assembly EMI shield 810 of the system module package 800. FIG. 22C illustrates a side view of a system module package 800 shown in FIG. 22A that incorporates the wire cage 700 shown in FIG. 21 in accordance with a representative embodiment in which the wire cage 700 is spaced apart from the top assembly EMI shield 810 of the system module package 800 by a preselected distance.

With reference to FIG. 21, the wire cage 700 comprises a conductive base 701 having first, second, third and fourth conductive horizontal bars 701a, 701b, 701c and 701d, respectively. The conductive horizontal bars 701a-701d may be connected together end-to-end via a process such as welding, for example, or the conductive base 701 may be an integrally-formed, unitary part such that ends of adjacent conductive horizontal bars 701a-701d are integrally joined. A plurality of conductive rails 702 are electrically coupled to the conductive base 701. In accordance with a representative embodiment, each of the conductive rails 702 is a bond wire having first and second ends that are electrically coupled to a bottom surface 701e of the conductive base 701.

With reference to FIG. 22A, when the wire cage 700 is installed in the system module package 800, the conductive rails 702 that are electrically coupled to the first, second, third and fourth conductive horizontal bars 701a, 701b, 701c and 701d, respectively, are in first, second, third and fourth fence planes, respectively, that are substantially perpendicular to the top surface 801a of the substrate 801. The first, second, third and fourth fence planes define first, second, third and fourth sides, respectively, of a compartment boundary. Thus, each of the conductive rails 702 is in one of the first, second third and fourth fence planes. A first set of electrical components is mounted on the top surface 801a of the substrate 801 in a first compartment and a second set of electrical components is mounted on the top surface 801a of the substrate 801 in a second compartment, which is external to the first compartment. For illustrative purposes, the first and second sets of electrical components are shown in FIGS. 22A-22C as consisting of first and second electrical components 802 and 803, respectively.

In accordance with this representative embodiment, each of the conductive rails 702 has a middle portion that is in contact with a respective electrical bond pad 805 that couples the respective conductive rail 702 to the top surface 801a of the substrate 801. The respective electrical bond pad 805 is electrically coupled to a common voltage potential. In other words, each of the conductive rails 702 is electrically connected to the common voltage potential via the respective electrical bond pad 805. As the conductive horizontal bars 701a, 701b, 701c and 701d are connected to the conductive rails 702, the conductive horizontal bars 701a, 701b, 701c and 701d are electrically connected to the common voltage potential.

In another embodiment, only a first set (not all) of the conductive rails 702 are connected directly to the corresponding electrical bond pads 805 to establish electrical connections to the common voltage potential. Through the first set of the conductive rails 702, the conductive horizontal bars 701a, 701b, 701c and 701d are connected to the common voltage potential. The remaining conductive rails 702 in a second set which are not connected directly to an electrical bond pad 705 are connected to the conductive horizontal bars 701a, 701b, 701c and 701d. In this way, the second set of conductive rails 702 are connected to the common voltage potential via the conductive horizontal bars 701a, 701b, 701c and 701d.

While FIG. 22A shows the conductive rails 702 being indirectly coupled to the substrate 801 via the electrical bond pads 805, the conductive rails 702 could instead be directly coupled to the substrate 801. In the installed position of the wire cage 700 shown in FIG. 22A, the conductive base 701 is positioned above the top surface 801a of the substrate 801 and separated therefrom by a preselected distance, D. In the installed position of the wire cage 700 shown in FIG. 22A, the bottom surface 701e of the conductive base 701 is substantially parallel to the top surface 801a of the substrate 801. In other words, the conductive base 701 is arranged on a horizontal plane that is in parallel to, but distanced away from, the top surface 801a of the substrate 801. The conductive rails 702 have similar heights (Z-direction).

With reference to FIG. 22B, after an EMC 808 has been formed to encapsulate the first and second electrical components 802 and 803, respectively, and the wire cage 700, the aforementioned strip grinding process is performed to thin the EMC 808 to expose the conductive base 701. A top assembly EMI shield 810 is then formed on or in the EMC 808 such that the top assembly EMI shield 810 is in contact with the conductive base 701.

With reference to FIG. 22C, after the EMC 808 has been formed to encapsulate the first and second electrical components 802 and 803, respectively, and the wire cage 700, the top assembly EMI shield 810 is formed on or in the EMC 808 such that the top assembly EMI shield 810 is spaced apart from the conductive base 701 by a preselected distance.

Figure 23:
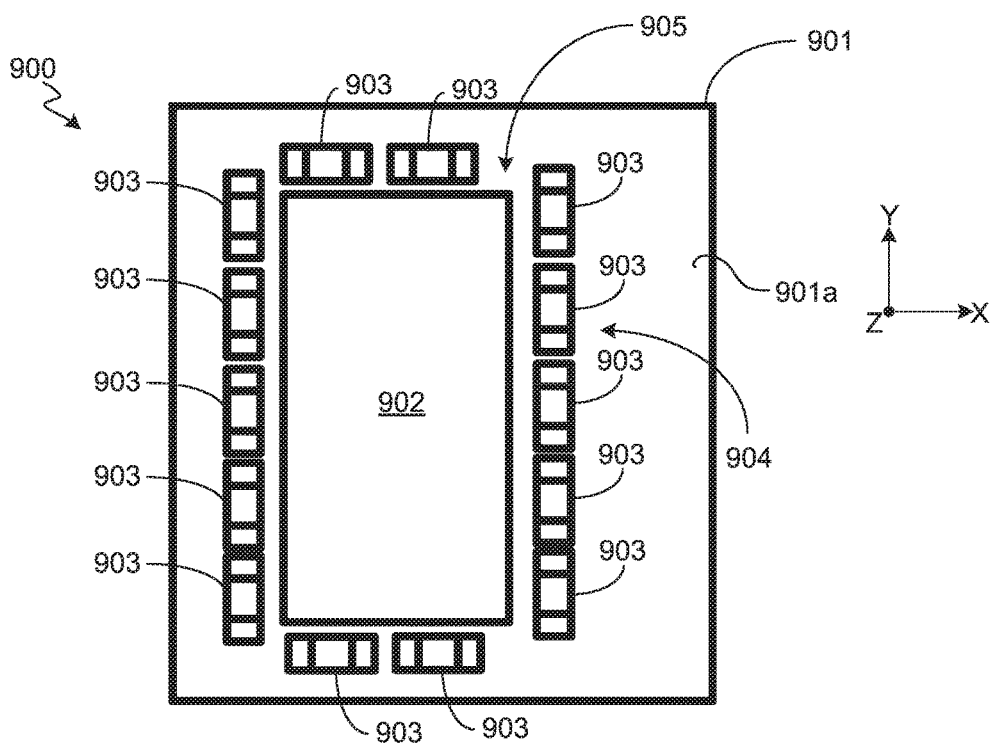
FIG. 23 illustrates a top view of a portion of a system module package having a substrate, a first electrical component of a first set of electrical components mounted on a top surface of the substrate, and having a plurality of semiconductor packages arranged along a compartment boundary and forming a conductive fence of a compartment EMI shield.

As indicated above with reference to FIGS. 1, 2 and 7, in accordance with another representative embodiment, the substantially vertical conductive structures of the compartment EMI shield are respective semiconductor packages arranged along a compartment boundary and forming the conductive fence of the compartment EMI shield that separates the first compartment from the second compartment, as will be described below in more detail with reference to FIGS. 23-27B. FIG. 23 illustrates a top view of a portion of a system module package 900 having a substrate 901, a first electrical component 902 of a first set of electrical components mounted on a top surface 901a of the substrate 901, and having a plurality of semiconductor packages 903 arranged along a compartment boundary and forming the conductive fence 904 of the compartment EMI shield that separates the first compartment 905 from the second compartment (not shown for clarity). The plurality of semiconductor packages 903 correspond to the substantially vertical conductive structures 98 shown in FIG. 7 that comprise the conductive fence 81 shown in FIGS. 5 and 6.

Figure 24:
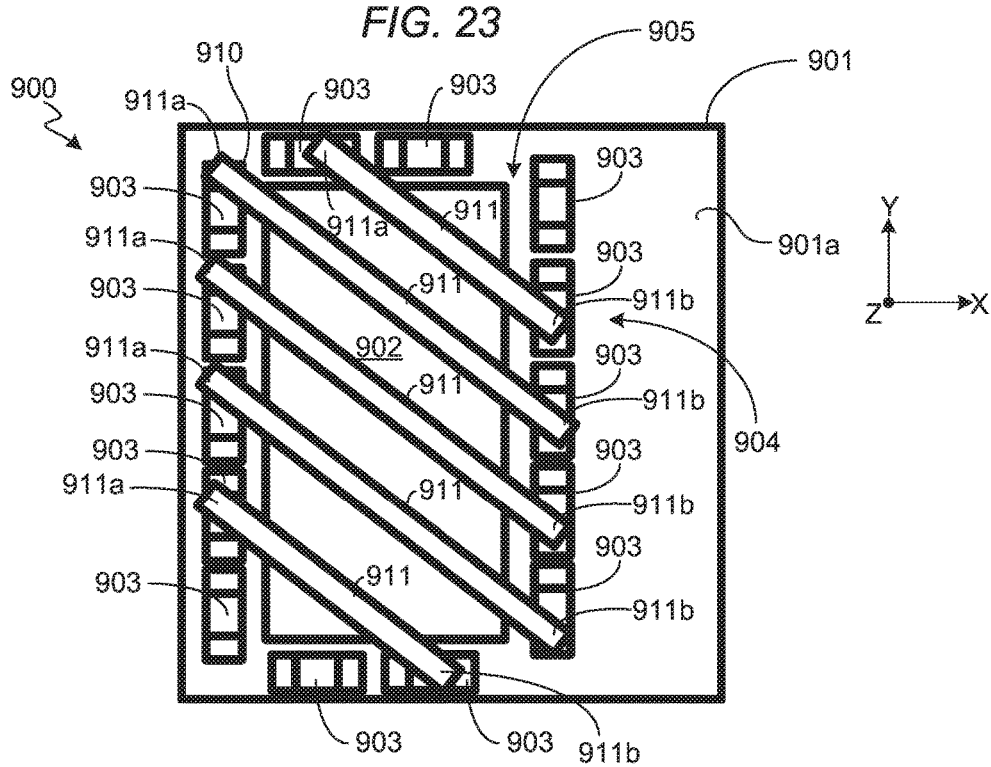
FIG. 24 illustrates a top view of the portion of the system module package shown in FIG. 23 having a plurality of conductive horizontal bars having first and second ends that are electrically coupled to respective semiconductor packages arranged along the compartment boundary.

FIG. 24 illustrates a top view of a portion of a system module package 900 shown in FIG. 23 having a plurality of conductive horizontal bars 911 having first ends 911a that are electrically coupled to respective semiconductor packages 903 arranged along a side of the first compartment 905 and having second ends 911b that are electrically coupled to respective semiconductor packages 903 arranged along a different side of the first compartment 905 such that the conductive horizontal bars 911 extend over the first electrical component 902. The plurality of conductive horizontal bars 911 comprise the substantially horizontal conductive structure 85 shown in FIGS. 5-7, where each conductive horizontal bar 911 corresponds to the conductive horizontal bar 97 shown in FIG. 7. Adjacent conductive horizontal bars 911 are spaced apart from one another by a pitch, P, that is preselected based at least in part of the frequency of interest, or frequency range of interest, that is to be attenuated by the compartment EMI shield. The conductive horizontal bars 911 are arranged in a plane that is substantially horizontal to the top surface 901a of the substrate 901 and are typically parallel to one another.

The compartment EMI shield, in accordance with this representative embodiment, comprises the conductive fence 904, which is made up of the semiconductor packages 903 arranged along the compartment boundary, and the substantially horizontal conductive structure, which is made up of the plurality of conductive horizontal bars 911.

Figure 25:
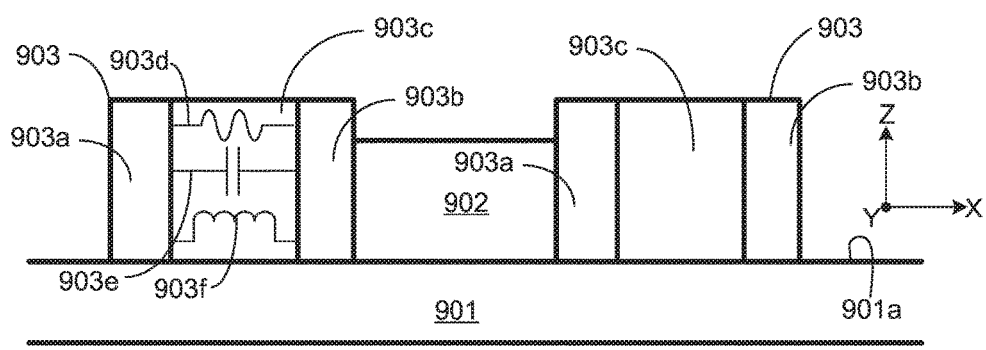
FIG. 25 illustrates a side view of the portion of system module package shown in FIG. 23 without the plurality of conductive horizontal bars shown in FIG. 24.
Figure 26:
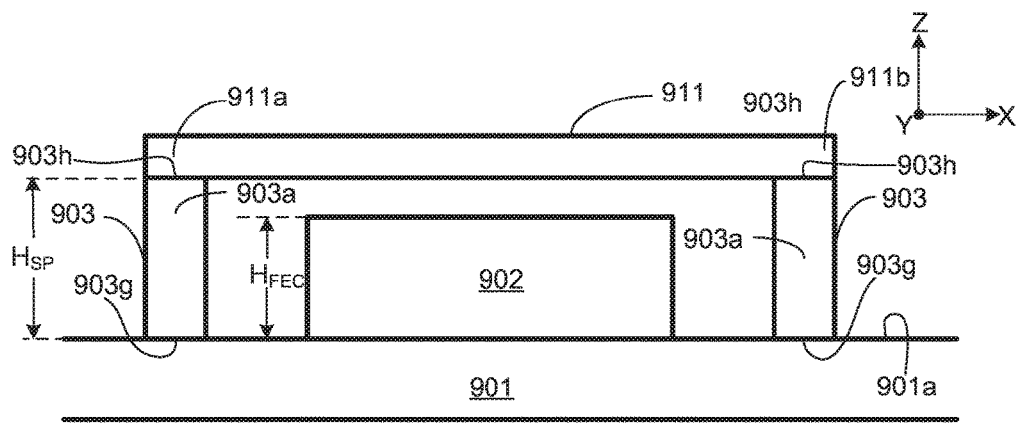
FIG. 26 illustrates an end view of the portion of system module package shown in FIG. 24 that includes the plurality of conductive horizontal bars shown in FIG. 24.

FIG. 25 illustrates a side view of the portion of the system module package 900 shown in FIG. 23 without the plurality of conductive horizontal bars 911 shown in FIG. 24. FIG. 26 illustrates an end view of the portion of system module package 900 shown in FIG. 24 that includes the plurality of conductive horizontal bars 911. With reference to the side view shown in FIG. 25, in accordance with a representative embodiment, each of the semiconductor packages 903 is a dummy semiconductor package that has no electrical functionality. In accordance with this embodiment, each semiconductor package 903 has two exposed conductive plates 903a and 903b that extend in respective planes that are substantially parallel to one another and substantially perpendicular to the top surface 901a of the substrate 901.

In accordance with an embodiment, each semiconductor package 903 has a non-conductive body 903c comprising non-conductive material (i.e., dielectric material) such that each semiconductor package 903 is devoid of electrical functionality. In accordance with another representative embodiment, each semiconductor package 903 has a passive electrical component encapsulated in the non-conductive body 903c and interconnecting the respective two exposed conductive plates 903a and 903ba, as depicted in FIG. 25. The passive electrical component may be, for example, one or more of a resistor 903d, a capacitor 903e, and an inductor 903f, as depicted in FIG. 25.

With reference to the end view shown in FIG. 26, first ends 903g of each of the semiconductor packages 903 are coupled to the top surface 901a of the substrate 901 or to electrical bond pads (not shown) disposed on the top surface 901a of the substrate 901. Second ends 903h of each of the semiconductor packages 903 are coupled to either the first end 911a or the second end 911b of a respective conductive horizontal bar 911. Each semiconductor package 903 has a height, $H_{SP}$, corresponding to a distance of its second end 903h from the top surface 901a of the substrate 901 in a direction substantially normal to the top surface 901a of the substrate 901 that is greater than a height, $H_{FEC}$, of the first electrical component 902, which is also measured from the top surface 901a of the substrate 901 in a direction substantially normal to the top surface 901a of the substrate 901. Actually, each semiconductor package has a height that is greater than the height of the tallest electrical component of the first set of electrical components, but the first set of electrical components is shown in FIGS. 23-26 as consisting only of the first electrical component 902. The height $H_{SP}$ of the semiconductor packages 903 is typically equal, or substantially equal, for all of the semiconductor packages 903.

Figure 27A:
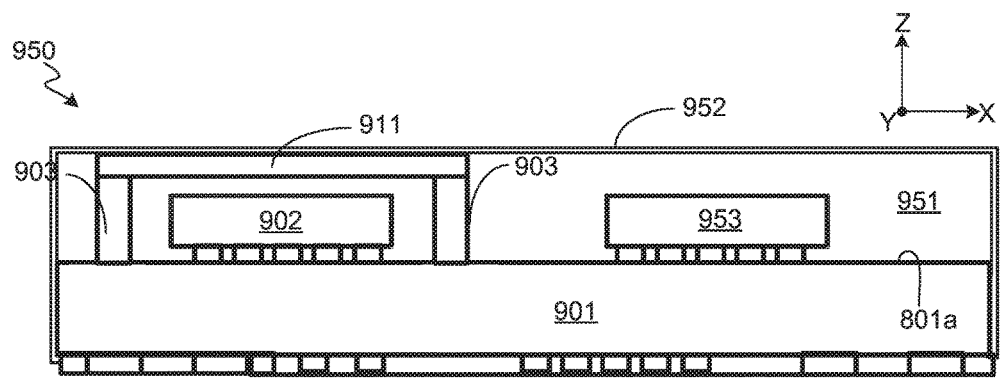
FIG. 27A illustrates a side view of a system module package in accordance with a representative embodiment that employs the compartment EMI shield described above with reference to FIGS. 23-26 comprising the semiconductor packages and the conductive horizontal bars.

FIG. 27A illustrates a side view of a system module package 950 in accordance with a representative embodiment that employs the compartment EMI shield described above with reference to FIGS. 23-26 comprising the semiconductor packages 903 and the conductive horizontal bars 911. After an EMC 951 has been formed to encapsulate the first and second electrical components 902 and 953, respectively, and the semiconductor packages 903 and conductive horizontal bars 911 comprising the compartment EMI shield, the aforementioned strip grinding process is performed to thin the EMC 951 to expose the conductive horizontal bars 911. A top assembly EMI shield 952 is then formed on or in the EMC 951 such that the top assembly EMI shield 952 is in contact with the conductive horizontal bars 911.

Figure 27B:
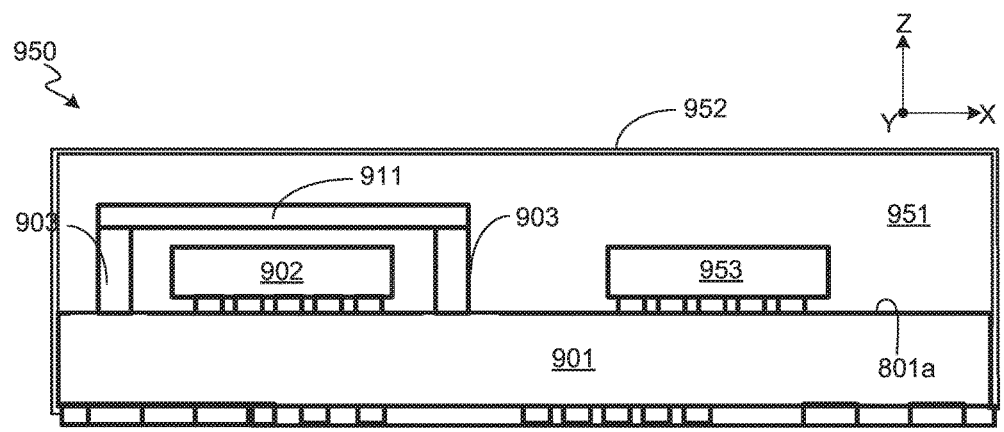
FIG. 27B illustrates a side view of a system module package in accordance with another representative embodiment that employs the compartment EMI shield described above with reference to FIGS. 23-26 comprising the semiconductor packages and the conductive horizontal bars.

FIG. 27B illustrates a side view of a system module package 950 in accordance with another representative embodiment that employs the compartment EMI shield described above with reference to FIGS. 23-26 comprising the semiconductor packages 903 and the conductive horizontal bars 911. After an EMC 951 has been formed to encapsulate the first and second electrical components 902 and 953, respectively, and the semiconductor packages 903 and conductive horizontal bars 911 comprising the compartment EMI shield, the top assembly EMI shield 952 is formed on or in the EMC 951 such that the top assembly EMI shield 952 is in contact with the conductive horizontal bars 911. Because no thinning of the EMC 951 has been performed, the conductive horizontal bars 911 are disposed at a preselected distance away from the top assembly EMI shield 952.

It should be noted that the illustrative embodiments have been described with reference to a few embodiments for the purpose of demonstrating the principles and concepts of the invention. Persons of skill in the art will understand how the principles and concepts of the invention can be applied to other embodiments not explicitly described herein. For example, while the compartment EMI shields and the first compartments are shown as being rectangular in shape, they can have virtually any desired shape. Also, while the substantially vertical and horizontal conductive structures have been shown and described as having a few different shapes and configurations, they may have other shapes and configurations. As will be understood by those skilled in the art in view of the description being provided herein, many modifications may be made to the embodiments described herein while still achieving the goals of the invention, and all such modifications are within the scope of the invention.

What is claimed is:

1. A system module package comprising:
   a substrate;
   a first compartment having a first set of electrical components disposed on a top surface of the substrate, the first set of electrical components including at least a first electrical component;
   a second set of electrical components disposed on the top surface of the substrate external to the first compartment, the second set of electrical components including at least a second electrical component; and
   a compartment electromagnetic interference (EMI) shield comprising a fence that extends substantially laterally along a compartment boundary at least in between the first and second sets of electrical components of the system module package, the fence comprising a plurality of substantially vertical conductive structures arranged along the compartment boundary and forming the fence, adjacent substantially vertical conductive structures being spaced apart from one another by a pitch that is preselected to ensure that the compartment EMI shield attenuates EMI of a frequency of interest, the fence extending substantially vertically relative to the top surface of the substrate, the fence being configured to attenuate EMI of a frequency of interest traveling in at least one of a first direction and a second direction, the first direction being from the first set of electrical components toward the second set of electrical components, the second direction being from the second set of electrical components toward the first set of electrical components, wherein each of the substantially vertical conductive structures has at least a first end that is mechanically coupled to the top surface of the substrate and has a highest point that is at a height, H, from the top surface of the substrate in a direction substantially normal to the top surface of the substrate, the height H being at least twice as great as a lateral distance, $D_L$, of the highest point from a center of the first end of the respective substantially vertical conductive structure in a direction substantially parallel to the top surface of the substrate.

2. The system module package of claim 1, wherein the plurality of substantially vertical conductive structures are electrically connected to a common voltage so as not to induce an electric field between the plurality of substantially vertical conductive structures.

3. The system module package of claim 1, wherein each of the substantially vertical conductive structures has at least a first end that is mechanically coupled to the top surface of the substrate and has a highest point that is at a height, H, from the top surface of the substrate in a direction substantially normal to the top surface of the substrate, wherein the plurality of substantially vertical conductive structures are of substantially equal lengths measured from the top surface of the substrate to the highest points of the substantially vertical conductive structures in a direction substantially normal to the top surface of the substrate.

4. The system module package of claim 1, further comprising a top assembly EMI shield disposed over at least the first compartment, wherein the plurality of substantially vertical conductive structures are physically separated from, but electrically coupled to, the top assembly EMI shield.

5. The system module package of claim 1, further comprising a conductive strip configured to provide a common return path for electric current, wherein at least a first end of each of the plurality of substantially vertical conductive structures is electrically coupled to the conductive strip.

6. The system module package of claim 5, wherein the conductive strip is disposed on the top surface of the substrate.

7. The system module package of claim 5, wherein the conductive strip is disposed beneath the top surface of the substrate.

8. The system module package of claim 5, wherein the plurality of substantially vertical conductive structures comprises at least one of electrical bond wires, conductive rails, conductive leads of a semiconductor package and conductive plates of a semiconductor package.

9. The system module package of claim 1, wherein each of the first and second sets of electrical components has a component height corresponding to a tallest electrical component of each of the first and second sets measured from the top surface of the substrate in a direction substantially normal to the top surface of the substrate to a top of the respective tallest electrical component, and wherein the component heights are less than a fence height measured from the top surface of the substrate to a top of the fence in a direction substantially normal to the top surface of the substrate.

10. A system module package comprising:
a substrate;
a first compartment having a first set of electrical components disposed on a top surface of the substrate, the first set of electrical components including at least a first electrical component;
a second set of electrical components disposed on the top surface of the substrate external to the first compartment, the second set of electrical components including at least a second electrical component; and
a compartment electromagnetic interference (EMI) shield comprising a fence comprising a plurality of substantially vertical conductive structures arranged along a compartment boundary and forming the fence, the substantially vertical conductive structures being bond wires having at least first ends that are mechanically and electrically coupled to a common electrical ground structure of the system module package, the first ends of the bond wires being spaced apart from one another by a pitch that is preselected to ensure that the compartment EMI shield attenuates EMI of a frequency of interest traveling in at least one of a first direction and a second direction, the first direction being from the first set of electrical components toward the second set of electrical components, the second direction being from the second set of electrical components toward the first set of electrical components.

11. The system module package of claim 10, wherein each bond wire has a second end that is mechanically and electrically coupled to the common electrical ground structure.

12. The system module package of claim 10, further comprising a conductive strip configured to provide a common return path for electric current, wherein at least a first end of each of the plurality of substantially vertical conductive structures is electrically coupled to the conductive strip.

13. The system module package of claim 12, wherein the conductive strip is disposed on the top surface of the substrate.

14. The system module package of claim 12, wherein the conductive strip is disposed beneath the top surface of the substrate.

15. A system module package comprising:
a substrate;
a first compartment having a first set of electrical components disposed on a top surface of the substrate, the first set of electrical components including at least a first electrical component;
a second set of electrical components disposed on the top surface of the substrate external to the first compartment, the second set of electrical components including at least a second electrical component;

a compartment electromagnetic interference (EMI) shield comprising a fence that extends substantially laterally along a compartment boundary at least in between the first and second sets of electrical components of the system module package, the fence comprising a plurality of substantially vertical conductive structures arranged along the compartment boundary and forming the fence, adjacent substantially vertical conductive structures being spaced apart from one another by a pitch that is preselected to ensure that the compartment EMI shield attenuates EMI of a frequency of interest, wherein the fence extends substantially vertically relative to the top surface of the substrate, the fence being configured to attenuate EMI of a frequency of interest traveling in at least one of a first direction and a second direction, the first direction being from the first set of electrical components toward the second set of electrical components, the second direction being from the second set of electrical components toward the first set of electrical components; and
a conductive strip configured to provide a common return path for electric current, wherein at least a first end of each of the plurality of substantially vertical conductive structures is electrically coupled to the conductive strip, wherein the plurality of substantially vertical conductive structures comprise a plurality of bond wires, each of the bond wires comprises a first end and a second end electrically coupled to the conductive strip.

16. The system module package of claim 15, wherein the first and second ends of each bond wire are directly connected to the conductive strip.

17. The system module package of claim 15, wherein the first and second ends of each bond wire are connected to respective electric bond pads that are connected to the conductive strip.

18. The system module package of claim 15, wherein the first and second ends of a first set of the bond wires lie in a fence plane that is substantially perpendicular to the top surface of the substrate and substantially parallel to a first side of the first electrical component, and wherein each bond wire of the first set of the bond wires has a highest point that is at a height, H, from the top surface of the substrate in a direction substantially normal to the top surface of the substrate, the highest point being located on a middle portion of the respective bond wire.

19. The system module package of claim 18, wherein the middle portions of the bond wires of the first set are in contact with a top assembly EMI shield of the system module package that extends over at least the first compartment.

20. The system module package of claim 18, wherein the middle portions are spaced apart a preselected distance from a top assembly EMI shield of the system module package such that a gap exists between the top assembly EMI shield and the middle portions, the gap having a size that is preselected based on a frequency of interest that the compartment EMI shield is intended to attenuate.

21. The system module package of claim 15, wherein the first and second ends of each bond wire are in first and second fence planes, respectively, that are substantially parallel to one another and substantially perpendicular to the top surface of the substrate, and wherein a middle portion of each bond wire is at a non-zero-degree angle to the first and second fence planes that is less than thirty degrees.

* * * * *